United States Patent
Okuyama

(10) Patent No.: US 10,516,080 B2
(45) Date of Patent: Dec. 24, 2019

(54) SEMICONDUCTOR DEVICE AND APPARATUS FOR IMPROVED LIGHT EMISSION

(71) Applicant: Sony Semiconductor Solutions Corporation, Kanagawa (JP)

(72) Inventor: Hiroyuki Okuyama, Tokyo (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 0 days.

(21) Appl. No.: 15/317,446

(22) PCT Filed: May 21, 2015

(86) PCT No.: PCT/JP2015/002561
§ 371 (c)(1),
(2) Date: Dec. 9, 2016

(87) PCT Pub. No.: WO2015/194095
PCT Pub. Date: Dec. 23, 2015

(65) Prior Publication Data
US 2017/0133554 A1 May 11, 2017

(30) Foreign Application Priority Data
Jun. 17, 2014 (JP) .................................. 2014-124143

(51) Int. Cl.
*H01L 29/15* (2006.01)
*H01L 31/0256* (2006.01)
(Continued)

(52) U.S. Cl.
CPC .......... *H01L 33/20* (2013.01); *H01L 25/0753* (2013.01); *H01L 33/0025* (2013.01);
(Continued)

(58) Field of Classification Search
CPC . H01L 33/0025; H01L 33/0062; H01L 33/30; H01L 33/0075; H01L 33/32;
(Continued)

(56) References Cited

U.S. PATENT DOCUMENTS 6,596,079 B1 * 7/2003 Vaudo .................... C30B 23/00
117/101
2003/0138981 A1 * 7/2003 Yamaguchi ........... B82Y 20/00
438/22
(Continued)

FOREIGN PATENT DOCUMENTS

EP    1798781 A2    6/2007
EP    2495761 A2    9/2012
(Continued)

OTHER PUBLICATIONS

U.S. Appl. No. 13/053,433, filed Mar. 22, 2011, Hirao.
U.S. Appl. No. 13/268,245, filed Oct. 7, 2011, Okuyama.
U.S. Appl. No. 15/167,410, filed May 27, 2016, Okuyama.

*Primary Examiner* — Nduka E Ojeh
(74) *Attorney, Agent, or Firm* — Wolf, Greenfield & Sacks, P.C.

(57) ABSTRACT

There is provided a semiconductor device (101), including: a first semiconductor layer (25) having a main surface that is a growth surface in a lamination direction and a first side surface (251) disposed at a first angle; and a second semiconductor layer (24) adjacent the first semiconductor layer (25) having a second side surface (241) extending from the first side surface (251) of the first semiconductor layer (25) at a second angle different from the first angle.

27 Claims, 14 Drawing Sheets

(51) Int. Cl.
    *H01L 33/20* (2010.01)
    *H01L 33/00* (2010.01)
    *H01L 33/30* (2010.01)
    *H01L 25/075* (2006.01)
    *H01L 33/40* (2010.01)
    *H01L 33/44* (2010.01)
    H01L 33/22 (2010.01)
    H01L 33/32 (2010.01)
    H01L 33/46 (2010.01)

(52) U.S. Cl.
    CPC .......... *H01L 33/0062* (2013.01); *H01L 33/30* (2013.01); *H01L 33/44* (2013.01); *H01L 33/0075* (2013.01); *H01L 33/0079* (2013.01); *H01L 33/22* (2013.01); *H01L 33/32* (2013.01); *H01L 33/405* (2013.01); *H01L 33/46* (2013.01); *H01L 2224/48* (2013.01)

(58) Field of Classification Search
    CPC ......... H01L 33/00; H01L 33/18; H01L 33/20; H01L 33/28; H01L 33/34
    USPC ............................ 257/76, 79, 40; 438/29, 42
    See application file for complete search history.

(56) References Cited

U.S. PATENT DOCUMENTS

| | | | | |
|---|---|---|---|---|
| 2004/0184499 | A1* | 9/2004 | Kondo | H01L 33/08 372/45.01 |
| 2006/0169997 | A1* | 8/2006 | Suzuki | H01L 33/20 257/95 |
| 2007/0085093 | A1* | 4/2007 | Ohmae | C30B 23/04 257/89 |
| 2007/0164298 | A1* | 7/2007 | Kim | H01L 33/0079 257/94 |
| 2010/0127295 | A1* | 5/2010 | Kim | H01L 33/20 257/98 |
| 2010/0265981 | A1* | 10/2010 | Hiroyama | H01L 33/007 372/49.01 |
| 2011/0193123 | A1* | 8/2011 | Moon | H01L 33/382 257/98 |
| 2011/0297980 | A1* | 12/2011 | Sugizaki | H01L 33/38 257/98 |
| 2012/0092389 | A1* | 4/2012 | Okuyama | G09F 9/33 345/690 |
| 2012/0171791 | A1* | 7/2012 | Tu | H01L 33/007 438/33 |
| 2013/0082295 | A1* | 4/2013 | Yoshida | H01L 33/44 257/98 |
| 2013/0146928 | A1* | 6/2013 | Inoue | H01L 33/20 257/98 |
| 2013/0214288 | A1* | 8/2013 | Yokogawa | H01L 33/32 257/76 |
| 2013/0228744 | A1* | 9/2013 | Kazama | H01L 33/382 257/13 |
| 2013/0299858 | A1* | 11/2013 | Kar | H01L 33/40 257/98 |
| 2014/0034980 | A1* | 2/2014 | Kazama | H01L 33/22 257/98 |
| 2014/0138729 | A1 | 5/2014 | Kim et al. | |
| 2014/0227813 | A1* | 8/2014 | Yoneda | H01L 33/0095 438/33 |
| 2014/0319551 | A1* | 10/2014 | Igarashi | H01L 33/56 257/88 |
| 2016/0087003 | A1* | 3/2016 | Lee | H01L 27/153 257/88 |

FOREIGN PATENT DOCUMENTS

| | | |
|---|---|---|
| JP | 62-281387 A | 12/1987 |
| JP | 2012-182276 A | 9/2012 |

\* cited by examiner

SEMICONDUCTOR DEVICE AND APPARATUS FOR IMPROVED LIGHT EMISSION

CROSS REFERENCE TO RELATED APPLICATIONS

This Application is a national stage filing under 35 U.S.C. 371 of International Patent Application Serial No. PCT/JP2015/002561, filed May 21, 2015, entitled "SEMICONDUCTOR DEVICE, PACKAGE DEVICE, LIGHT-EMITTING PANEL APPARATUS, WAFER AND METHOD OF PRODUCING A SEMICONDUCTOR DEVICE". This application claims the benefit of Japanese Patent Application JP 2014-124143 filed Jun. 17, 2014, the entire content of which is incorporated herein by reference.

TECHNICAL FIELD

The present technology relates to a semiconductor device technology such as a light-emitting device and a switching device.

BACKGROUND ART

In recent years, as a light-weight and thin display device, a light-emitting diode (LED) display using an LED as a display pixel has been drawn attention. The LED display is characterized to have no view angle dependency that a contrast and a tint are changed by a view angle and to have a fast response speed when a color is changed. A light-emitting device suitable to be used in the LED display is disclosed in Patent Document 1, for example. The light-emitting device in Patent Document 1 has an inverted trapezoid shape, for example (see FIG. 2(a) etc. in Patent Document 1, for example).

CITATION LIST

Patent Literature

PTL 1: Japanese Patent Application Laid-open No. 2012-182276

SUMMARY

Technical Problem

There is a room for improvement about, for example, a shape of a semiconductor device in the above-described light-emitting device.

An object of the present technology is to provide a semiconductor device having an improved shape, a package device, a light-emitting panel apparatus, a wafer and a method of producing a semiconductor device.

Solution to Problem

In order to achieve the above-described object, a semiconductor device according to the present technology includes a first semiconductor layer and a second semiconductor layer. The first semiconductor layer having a main surface that is a growth surface in a lamination direction and a first side surface disposed at a first angle, and the second semiconductor layer adjacent the first semiconductor layer having a second side surface extending from the first side surface of the first semiconductor layer at a second angle different from the first angle.

Other semiconductor device according to the present technology includes a first semiconductor layer, and a second semiconductor layer formed on the first semiconductor layer in a lamination direction. The first semiconductor layer and the second semiconductor layer have concave parts formed into the respective layers, and the concave parts have a first inner surface having a first angle with respect to the lamination direction in the first semiconductor layer and a second inner surface having a second angle different from the first angle in the second semiconductor layer.

Other package device according to the present technology includes a substrate.

A plurality of semiconductor devices mounted on the substrate; and a resin sealing part disposed on the substrate and covering at least some of the plurality of semiconductor devices. At least one of the plurality of the semiconductor devices has a first semiconductor layer having a main surface that is perpendicular to a lamination direction and a side surface disposed at a first angle with respect to the lamination direction. The second semiconductor layer adjacent the first semiconductor layer has a side surface extending from the side surface of the first semiconductor layer at a second angle different from the first angle.

A light-emitting panel apparatus according to the present technology includes a light-emitting panel including a substrate, a plurality of light-emitting devices mounted on the substrate, and a resin sealing part disposed on the substrate covering at least some of the plurality of the light-emitting devices, and a driving circuit driving the light-emitting panel. At least one of the plurality of the light-emitting devices has a first semiconductor layer having a main surface that is perpendicular to a lamination direction and a side surface disposed at a first angle with respect to the lamination direction, and a second semiconductor layer adjacent the first semiconductor layer has a side surface extending from the side surface of the first semiconductor layer at a second angle different from the first angle.

A wafer according to the present technology includes a substrate and a plurality of semiconductor devices regularly arranged on the substrate. At least one of a plurality of the semiconductor devices having a first semiconductor layer having a main surface that is perpendicular to a lamination direction and a side surface disposed at a first angle with respect to the lamination direction. A second semiconductor layer adjacent the first semiconductor layer having a side surface extending from the side surface of the first semiconductor layer at a second angle different from the first angle.

A method of producing a semiconductor device according to the present technology includes epitaxially growing a first semiconductor layer, epitaxially growing in a growth direction a second semiconductor layer adjacent the first semiconductor layer; and etching at least one of the first semiconductor layer or the second semiconductor layer such that a side surface of the first semiconductor layer has a first angle with respect to the growth direction and such that a side surface of the second semiconductor layer has a second angle different from the first angle.

Advantageous Effects of Invention

As described above, according to the present technology, a semiconductor device having an improved shape and an apparatus including the same can be realized.

The effects herein described are not necessarily limited, and any of effects described in the present disclosure may be provided.

DESCRIPTION OF EMBODIMENTS

Figure 1A:
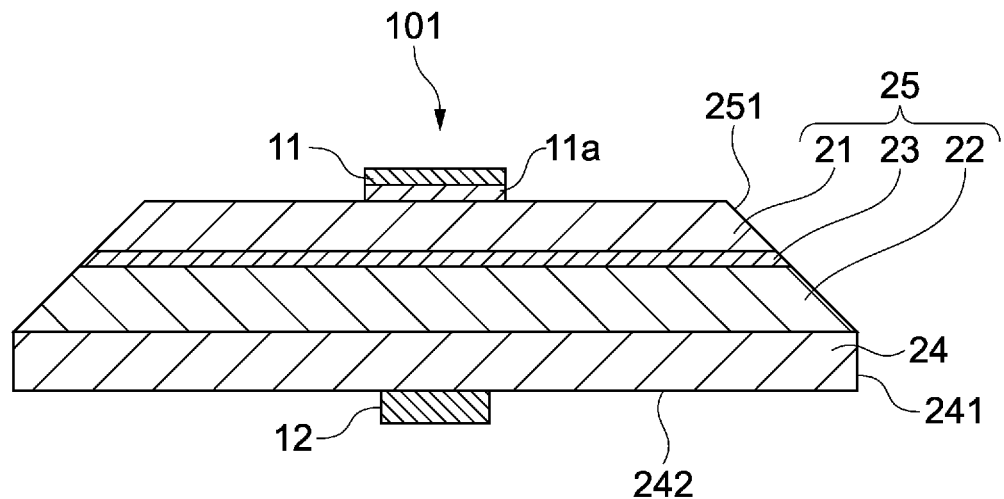
FIG. 1A is a cross-sectional diagram showing a configuration of a light-emitting device as a semiconductor device according to a first embodiment of the present technology.

Hereinafter, referring to the drawings, embodiments of the present technology will be described.

In the following description, referring to the drawings, a direction or a position of a device or an apparatus may be indicated by a wording like "up, down, left, right, vertical or horizontal". The wording may just be for description as a matter of convenience. In other words, the wording may often be used for better understanding of the description and may not coincide with the direction or the position when the device or the apparatus is actually produced or used.

First Embodiment (Configuration of Light-Emitting Device)

FIG. 1A is a cross-sectional diagram showing a configuration of a light-emitting device as a semiconductor device according to a first embodiment of the present technology.

A light-emitting device 101 is a micro LED having a size of micrometer order. The light-emitting device 101 includes a first electrode 11, a first contact layer 11a, a first conductivity type layer 21, an active layer 23, a second conductivity type layer 22, a second contact layer 24 and a second electrode 12 from an upper layer side.

The first conductivity type layer 21 is composed of Si-doped AlGaInP, for example. The AlGaInP is correctly represented by $(Al_xGa_{1-x})_{0.5}In_{0.5}P$. For example, x=0.7. $(Al_xGa_{1-x})_{0.5}$ and $In_{0.5}P$ may have a distortion such as $(Al_xGa_{1-x})_{0.49}$, $In_{0.51}$ etc.

The active layer 23 has a multiple quantum well structure and is composed of 3 to 20 layers of GaInP/AlGaInP.

The second conductivity type layer 22 is composed of Mg-doped AlGaInP, for example. A structure (intermediate layer) for decreasing an Al composition, lessening a band discontinuity between semiconductors and decreasing an operating voltage may be inserted between the second conductivity type layer 22 and the second contact layer 24. In other words, the second contact layer 24 may be directly connected to the second conductivity type layer 22 or may be connected via the intermediate layer. The second contact layer 24 is composed of Mg-doped GaP and Zn-doped GaP from a second conductivity type layer 22 side, for example. Note that the second contact layer 24 may also substantially function as the conductivity type layer (second conductivity type layer).

The first electrode 11 is composed of AuGe/Ni/Au/barrier metal from the first conductivity type layer 21 at a lower side thereof. The first electrode 11 is not limited to the configuration and may contain Cu, Pt, etc.

When GaAs:Si (having a thickness of about 100 nm) that easily makes contact with AuGe is grown as the first contact layer 11a between the first electrode 11 and the first conductivity type layer 21, it contributes to further decrease the voltage. However, the first contact layer 11a may not be necessarily disposed.

The second electrode 12 is composed of Ti/Pt/Au, for example, but is not limited thereto and may contain Pd/Pt/Au, Au, Cu, etc.

As described above, the light-emitting device 101 is composed of a GaP based material and is a micro LED emitting red light.

In the specification, a layer composed of the first conductivity type layer 21, the active layer 23 and the second conductivity type layer 22 refers to as "a first semiconductor layer" as a matter of convenience to which a symbol 25 is attached in this embodiment. The second contact layer 24 corresponds to "a second semiconductor layer". Hereinafter, the first conductivity type layer 21, the active layer 23, the second conductivity type layer 22 and the second contact layer 24 may be referred to as "a semiconductor layer" (245), as a matter of convenience.

Figure 1B:
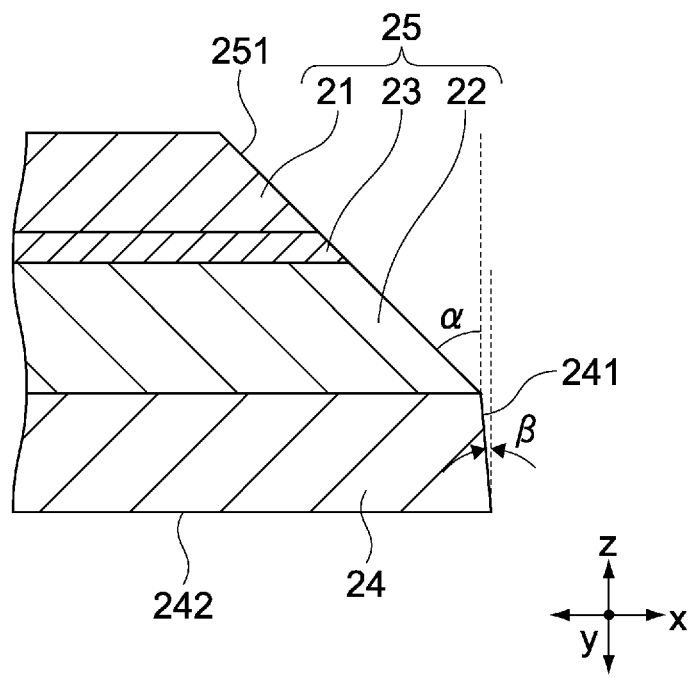
FIG. 1B shows an enlarged side surface of the light-emitting device in FIG. 1A.

FIG. 1B shows an enlarged side surface of the light-emitting device in FIG. 1A. Each side surface of the first conductivity type layer 21, the active layer 23 and the second conductivity type layer 22 continuously laminated, i.e., a side surface 251 of the first semiconductor layer 25 is disposed at a first angle alpha in the lamination direction of each layer, i.e., a z direction.

On the other hand, a side surface 241 of the second contact layer 24 continuously disposed on the side surface 251 of the first semiconductor layer 25 at an atomic layer level described later is disposed at a second angle β different from the first angle alpha in the z direction.

In other words, in this embodiment, the side surface 251 of the first semiconductor layer 25 containing In is at the first angle alpha and the side surface 241 of the second semiconductor layer 24 containing no In is at the first angle beta. In this manner, the light-emitting device 101 is realized as the semiconductor device having an improved novel shape.

For example, when an angle of the side surface (241) of the second contact layer (24) is the same as the first angle alpha, the second contact layer has pointed corners. Then, the pointed corners is likely to be "chipped". This may cause particles during production processes especially of the light-emitting device and may degrade reliability of products. In contrast, in this embodiment, the angle of the side surface 241 of the second contact layer 24 is along with the z direction or near the z direction as described below. Accordingly, such a problem can be solved.

It is assumed that the light-emitting device 101 has a configuration that light generated from the active layer 23 is extracted from a surface (herein referred to as "a lower surface" as a matter of convenience) of the second contact layer 24 being in contact with the second electrode 12. In this case, as the side surface 241 of the second contact layer 24 is nearly vertical, the side surface 241 has enhanced functions to reflect and guide the light from the active layer 23 to the lower surface (in other words, the light-extraction surface described later). In this manner, the light-extraction efficiency from the light-extraction surface 242 is enhanced and it contributes to a generation of lambertian light.

(Considerations about Atomic Layer Level Bonding of Semiconductor Layer)

Figure 2A:
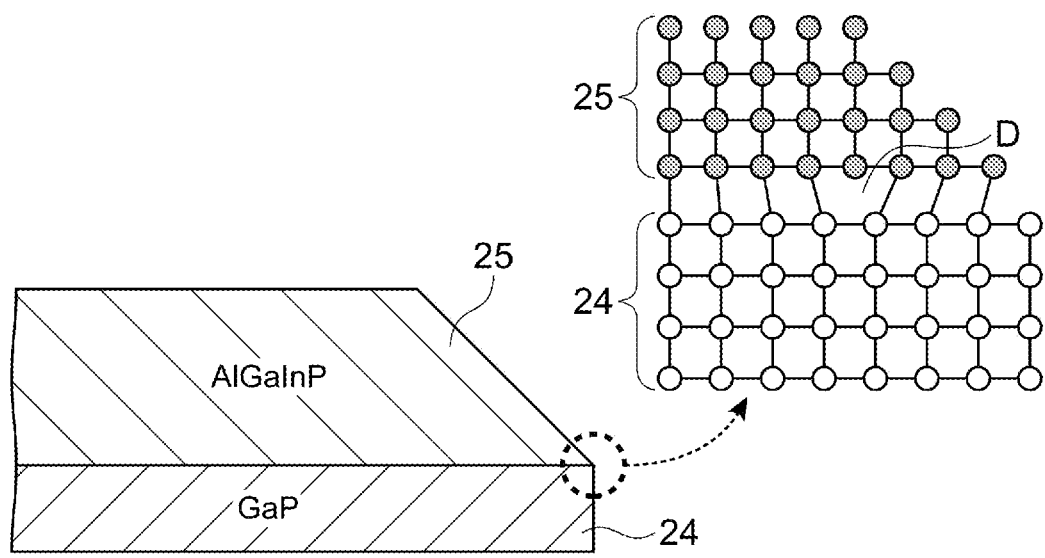
FIG. 2A schematically shows an interatomic bond of the first semiconductor layer and the second semiconductor layer.

FIG. 2A schematically shows an interatomic bond of the first semiconductor layer 25 and the second semiconductor layer 24. At an interface between the first semiconductor layer 25 (AlGaInP) and the second contact layer 24 (GaP), all atoms excluding lattice defects D are bonded. As described later, the semiconductor layer 245 is formed by an epitaxial growth (semiconductor crystal growth) on the substrate.

Figure 2B:
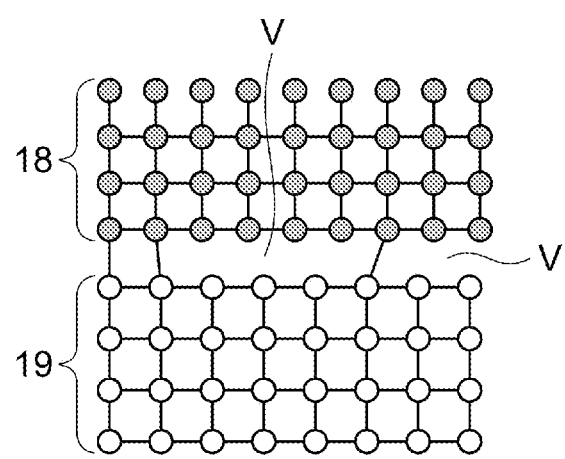
FIG. 2B schematically shows an interatomic bond when semiconductor layers are bonded by a normal temperature bonding, for example, as a comparative embodiment.

On the other hand, FIG. 2B schematically shows an interatomic bond when semiconductor layers 18, 19 are bonded by a normal temperature bonding, for example, as a comparative embodiment of FIG. 2A. In this way, at the interface between the two semiconductor layers 18, 19, voids V having volumes larger than those of the lattice defects are formed. In other words, in the boding method not by the epitaxial growth but by the normal temperature bonding, an atomic arrangement is not maintained and the voids V are formed.

(Main Processes of Method of Producing Light-Emitting Device)

Figure 3A:
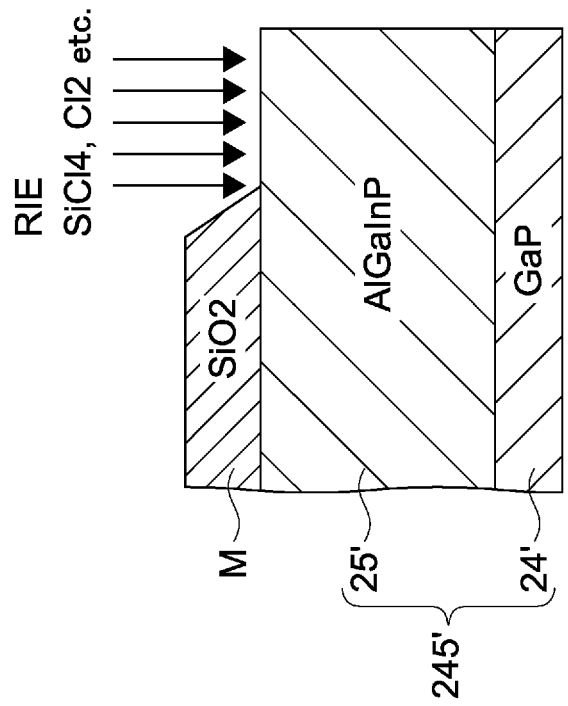
FIG. 3A shows main processes of the method of producing the above-described light-emitting device.
Figure 3B:
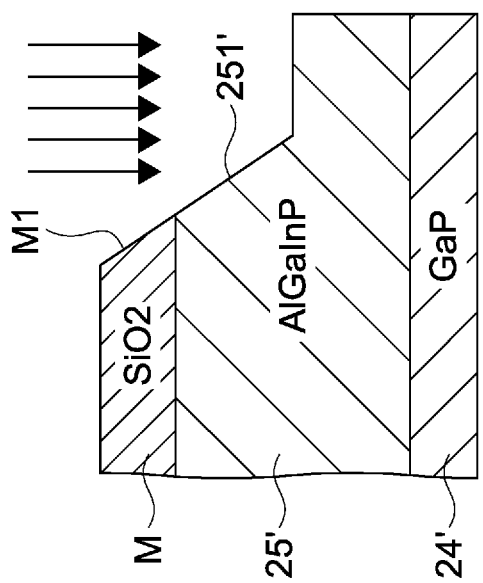
FIG. 3B shows main processes of the method of producing the above-described light-emitting device.
Figure 3C:
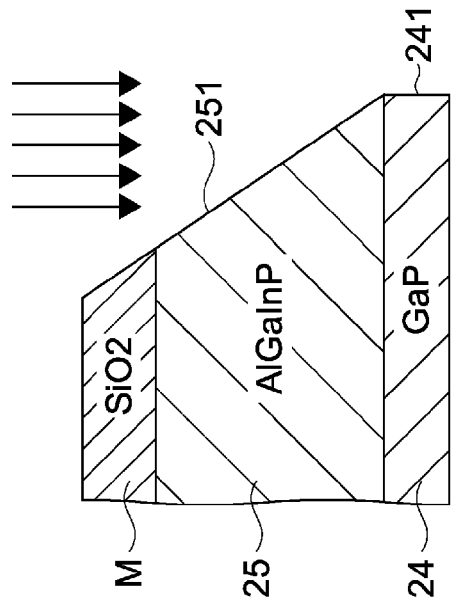
FIG. 3C shows main processes of the method of producing the above-described light-emitting device.

FIGS. 3A to 3C show main processes of the method of producing the above-described light-emitting device 101. Here, as described later, later processes are shown after a semiconductor layer 245' is formed on the substrate by an MOCVD (Metal Organic Chemical Vapor Deposition) or the like and a mask M made of Sift or the like is formed on the semiconductor layer.

As shown in FIG. 3A, an anisotropy etching is performed by a reactive ion etching (RIE), for example. An etching temperature is 100 degrees Celsius to 200 degrees Celsius. Etching gas is chlorine based gas such as $SiCl_4$ and $Cl_2$. As shown in FIG. 3B, a first semiconductor layer (AlGaInP) 25' on a second contact layer 24' is removed so that a side surface 251' forming a slope at the first angle is formed, resulting in a formation of the side surface 251 (see FIG. 3C).

In FIG. 3A, a side surface M1 of end of the mask M (e.g., an opening end of the mask M) has an angle to the z direction, thereby promoting the formation of the side surface 251' forming the slope of the first semiconductor layer 25'. However, even if the side surface M1 is vertical along the z direction, the side surface 251' of the first semiconductor layer 25' is formed as the slope.

An etching rate of the first semiconductor layer 25 is different from an etching rate of the second contact layer 24 (GaP). Specifically, the etching rate of the second contact layer 24 is higher than that of the first semiconductor layer 25. The etching rate of the first semiconductor layer 25 is 3 to 10 micrometer/h (for example, 6 micrometer/h) and the etching rate of the second contact layer 24 is 30 to 60 micrometer/h, for example.

The reason why the slope is formed on the first semiconductor layer 25 may be as follows:

Indium (In) is a substance that is less gasified and is likely to be deposited on the layer surface during etching depending on the etching temperature. As In deposited on the layer surface itself serves as the mask for etching, the material in a deeper position is unlikely to be removed. In contrast, in the second contact layer 24 containing no In, no such a phenomenon occurs, the side surface 241 will be formed almost vertically. As described above, the difference between the etching rates may contribute to promote such an action.

The etching temperature is 100 degrees Celsius to 200 degrees Celsius as described above. For example, it may be 100 degrees Celsius to 150 degrees Celsius. It may be 110 degrees Celsius, 120 degrees Celsius, 130 degrees Celsius, 140 degrees Celsius, or 1100 degrees Celsius to 140 degrees Celsius. Also, it may be 150 degrees Celsius to 200 degrees Celsius.

Second Embodiment

Figure 4:
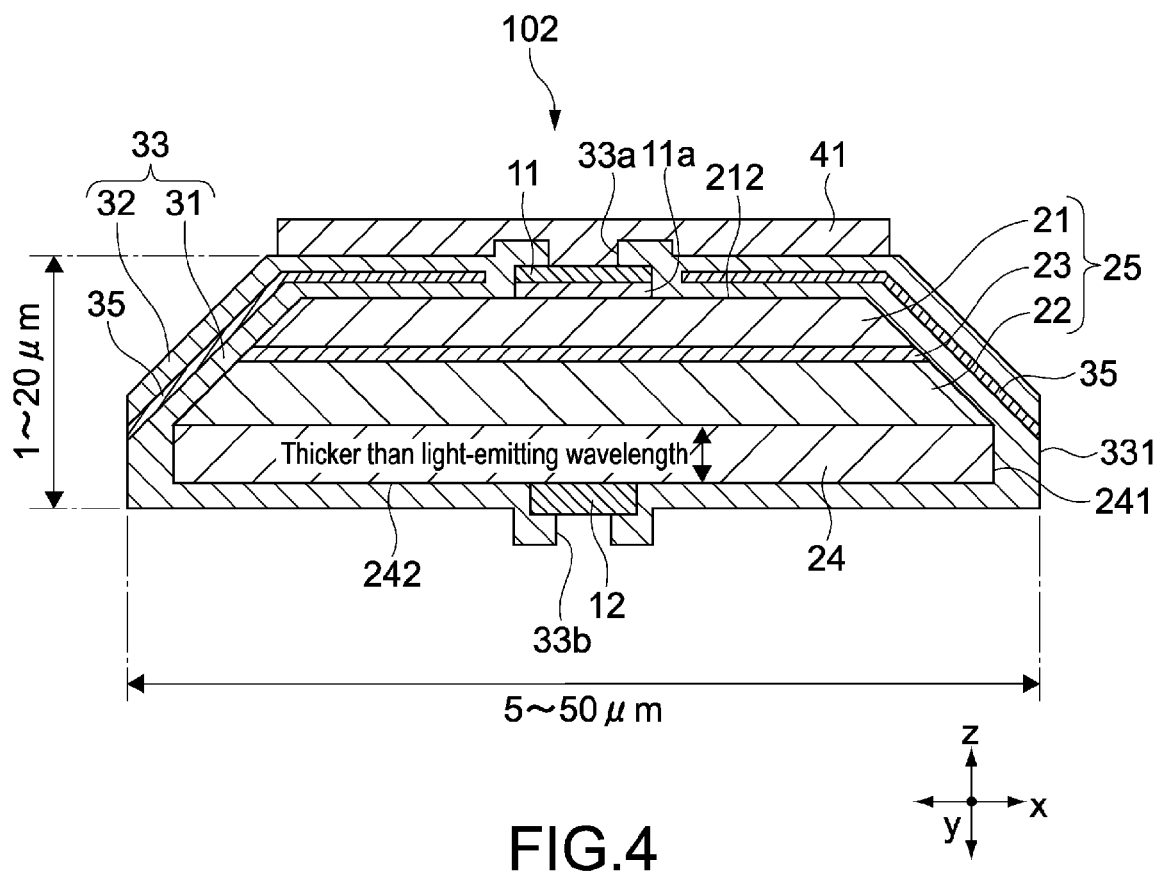
FIG. 4 is a cross-sectional diagram showing a configuration of a light-emitting device according to a second embodiment of the present technology.

FIG. 4 is a cross-sectional diagram showing a configuration of a light-emitting device according to a second embodiment of the present technology. Hereinafter, substantially same components included by the light-emitting device 101 according to the embodiment shown in FIG. 1 and so on are denoted by the same reference numerals, thus detailed description thereof will be simplified or omitted and different points are mainly described.

A light-emitting device 102 has an insulation layer 33 (dielectric film) covering at least the side surface of the semiconductor layer. For example, the insulation layer 33 covers not only the side surface of the semiconductor layer, but also the light-extraction surface 242 that is the lower surface of the second contact layer 24 and a surface 212 (hereinafter referred to as "upper layer" of the semiconductor layer as a matter of convenience) of the first conductivity type layer 21 in contact with the first contact layer 11a. On the insulation layer 33, a terminal electrode 41 is disposed. The terminal electrode 41 is connected to the first electrode 11 via an opening 33a formed in the insulation layer 33. At a lower side of the insulation layer 33, an opening 33b for connecting a wiring electrode 42 described later to the second electrode 12 is formed.

The insulation layer 33 is composed of a transparent material including $SiO_2$ or SiN, for example. Other transparent materials include $Al_2O_3$, $TiO_2$, TiN and the like.

Within the insulation layer 33, a metal layer (mirror) 35 is disposed facing to the upper surface and the side surface of the semiconductor layer. The metal layer 35 has functions to reflect the light generated from the active layer 23 and enhance the light-extraction efficiency from the light-extraction surface 242.

The metal layer 35 is composed of respective material of Al/Au/Ti laminated or respective material of Ti/Au/Ti laminated from an inner side (semiconductor side) to an outer side, for example. The terminal electrode 41 is composed of the same materials as the metal layer 35. It should be appreciated that the metal layer 35 and the terminal electrode 41 are not limited to these materials and lamination orders. The metal layer 35 is not conducted to the first electrode 11 and the second electrode 12 and is floated. The metal layer may be conducted to any of them.

The insulation layer 33 and the metal layer 35 are formed by CVD, vapor deposition, sputter or the like. For example, on the surfaces (side surface, upper surface and lower surface) of the semiconductor layer, a first insulation layer 31 is formed. On the first insulation layer 31, the metal layer 35 is formed. On the metal layer 35, a second insulation layer 32 is formed.

If the second contact layer has the side surface similar to the side surface forming the slope of the first semiconductor layer 25, the insulation layer disposed at the side surface of the second contact layer has the side surface forming the slope. In this case, the metal layer is formed to the same surface as the light-extraction surface at the same angle as the slope. In this case, when acute corners of the second contact layer and the acute insulation layer in contact with the side surface thereof are "chipped", particles that expose the metal layer are generated and adverse effect such as short circuit concerns about the light-emitting device and peripheral circuits thereof.

When the second contact layer 24 is too thin, there is no meaning. Form an optical perspective, in order to improve light-emitting properties, it is considered that the thickness should be greater than [light-emitting wavelength/refractive index], i.e., greater than the value provided by dividing the light-emitting wavelength by the refractive index of the second contact layer 24.

According to this embodiment, as the side surface 241 of the second contact layer 24 and the side surface 331 of the insulation layer 33 in contact with the side surface 241 are formed nearly vertically, the above-described concerns can be overcome. In this way, yields and reliability of products are improved.

As shown in FIG. 4, as a typical size of the light-emitting device 102, a width in the x direction is 5 to 50 micrometers, for example, 15 micrometers. A thickness in the x direction is 1 to 20 micrometers, for example, 3 to 4 micrometers. A length in the y direction is 5 to 50 micrometers, for example, 25 micrometers. It should be appreciated that the size is not limited to the range. In the case of the micro LED, as described above, the length in the x and y directions is 5 micrometers to 100 micrometers.

Third Embodiment

Figure 5:
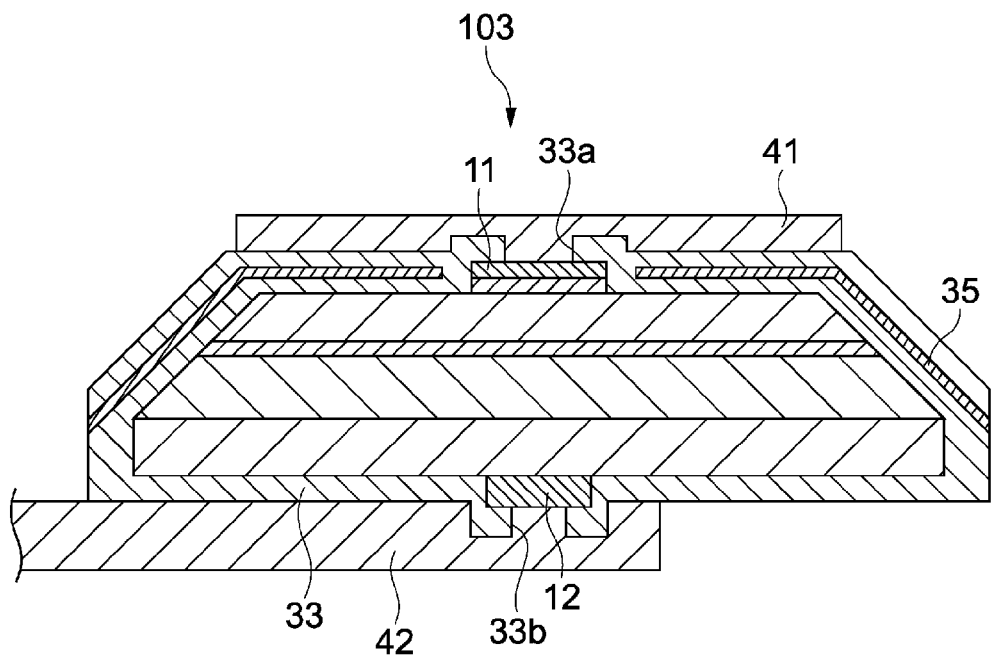
FIG. 5 is a cross-sectional diagram showing a configuration of a light-emitting device according to a third embodiment of the present technology.

FIG. 5 is a cross-sectional diagram showing a configuration of a light-emitting device according to a third embodiment of the present technology. A light-emitting device 103 is that a wiring electrode 42 is connected to the second electrode 12 of the light-emitting device 102 shown in FIG. 4. The wiring electrode 42 is formed through a part of the insulation layer 33 (in contact with the part), for example. The wiring electrode 42 is composed of Au, Cu or the like, for example, which is not limited thereto.

As described in the second embodiment, it is assumed that the second contact layer has the side surface similar to the side surface forming the slope of the first semiconductor layer. In this case, the metal layer formed within the insulation layer is flush with the light-extraction layer. Accordingly, so as not to short-circuit the metal layer and the wiring electrode, a part of the wiring electrode or a part of the metal layer should be removed, for example.

In contrast, in the light-emitting device 103 according to this embodiment, no structure for preventing the short circuit is necessary, thereby reducing the manufacturing costs.

Fourth Embodiment

Figure 6:
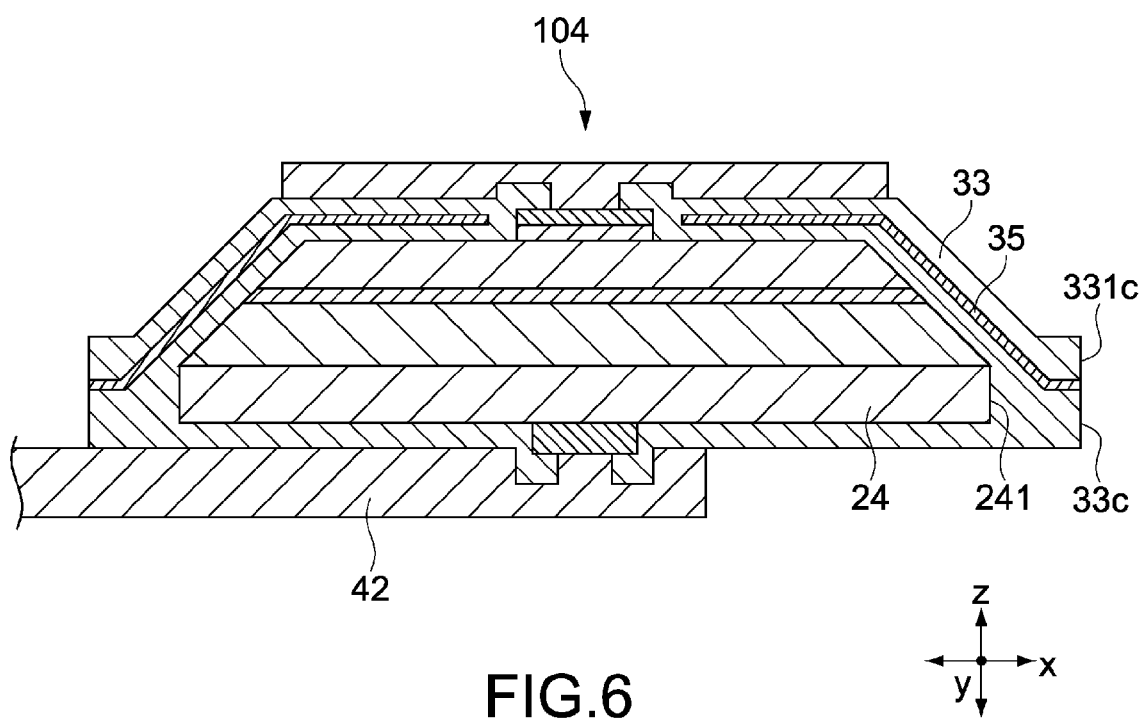
FIG. 6 is a cross-sectional diagram showing a configuration of a light-emitting device according to a fourth embodiment of the present technology.

FIG. 6 is a cross-sectional diagram showing a configuration of a light-emitting device according to a fourth embodiment of the present technology.

The insulation layer 33 of a light-emitting device 104 has an extended part 33c in contact with the side surface 241 of the second contact layer 24. The extended part 33c is configured by extending the insulation layer 33 at a predetermined length in the x direction. The metal layer 35 is formed to be exposed at a side surface 331c of the extended part 33c. In this manner, viewed in cross-section in FIG. 6, the metal layer 35 is along with the wiring electrode 42 (is in substantially parallel with the wiring electrode 42, for example), thereby further decreasing a risk of the short circuit.

Although, in this embodiment, the metal layer 35 is formed to be exposed at a side surface 331c of the extended part 33c, the extended part of the insulation layer 33 may be formed so as not to expose the metal layer.

Fifth Embodiment (Configuration of Light-Emitting Device)

Figure 7:
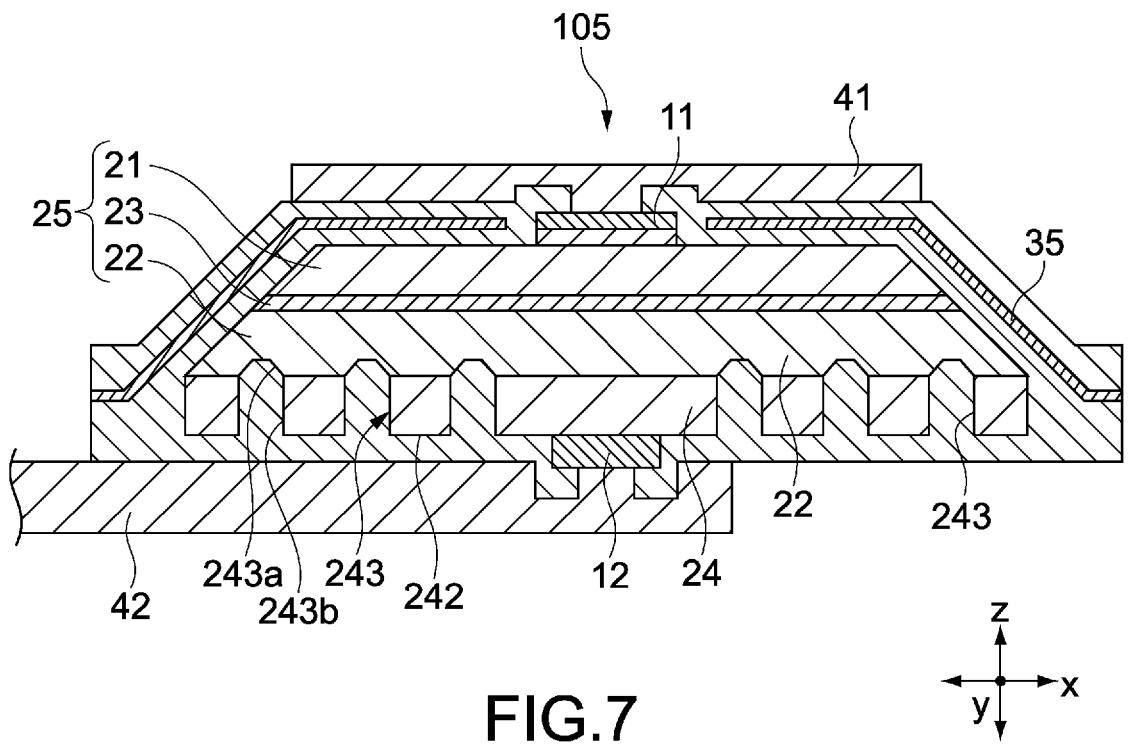
FIG. 7 is a cross-sectional diagram showing a configuration of a light-emitting device according to a fifth embodiment of the present technology.

FIG. 7 is a cross-sectional diagram showing a configuration of a light-emitting device according to a fifth embodiment of the present technology. A light-emitting device 105 has a configuration including the following characteristics in addition to the light-emitting device 104 show in FIG. 6.

The second contact layer 24 and the second conductivity type layer 22 of the light-emitting device 105 have concave parts 243 continuously formed from a light-extraction surface (lower surface) 242 side to the second conductivity type layer 22. The concave parts 243 are formed not arriving at the active layer 23. A plurality of concave parts 243 is disposed, thereby forming a texture structure on the light-extraction surface 242. The concave part 243 viewed in the light-extraction surface 242 side (viewed in the z direction) may have any shape such as circle, polygonal shapes such as rectangular and the like.

The concave part 243 has a first inner surface 243a formed in the second conductivity type layer 22 and a second inner surface 243b formed in the second contact layer 24. An angle of the first inner surface 243a to the lamination direction (a direction) is the first angle alpha (third angle) and an angle of the second inner surface 243b is the second angle beta (fourth angle). Using the production method described referring to FIG. 3, the configuration of the concave parts 243 can be formed. The concave parts 243 are also buried with the material of the insulation layer 33.

By disposing the concave parts 243, the total reflection of light within the semiconductor layer is suppressed, thereby enhancing the light-extraction efficiency on the light-extraction surface 242. In addition, as the second contact layer 24 can be etched at nearly vertical angle, the concave parts 243 can be deep, thereby providing further effects on the improvement of the light-extraction efficiency.

(Method of Producing Light-Emitting Device)

Next, a method of producing the light-emitting device according to the fifth embodiment will be described. FIGS. 8A to 8E and FIGS. 9A to 9D show the producing method in the order.

Figure 8A:
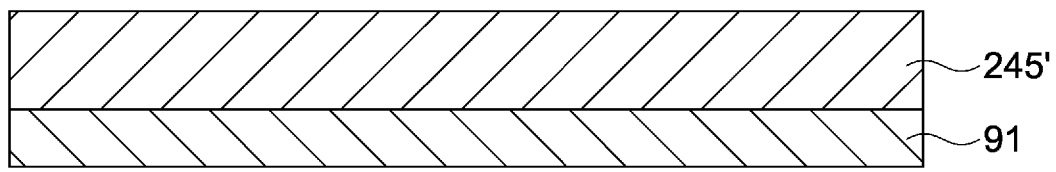
FIG. 8A shows a method of producing the light-emitting device according to the fifth embodiment in the order.

As shown in FIG. 8A, by the above-described MOCVD method, the semiconductor layer 245' is formed as a growing layer on the support substrate (first substrate) 91, for example. As the support substrate 91, a GaAs substrate is used, for example. Here, the first semiconductor layer 25 and the second semiconductor layer (second contact layer 24) are not separately shown. On the support substrate 91, the first semiconductor layer 25 is formed and the second semiconductor layer (second contact layer 24) is formed thereon by the crystal growth in the vertical direction (lamination direction). In other words, the vertical direction is the lamination direction of the first semiconductor layer 25 and the second semiconductor layer. The surface vertical to the lamination direction is the main surface that is the growth surface of the semiconductor crystal.

Figure 8B:
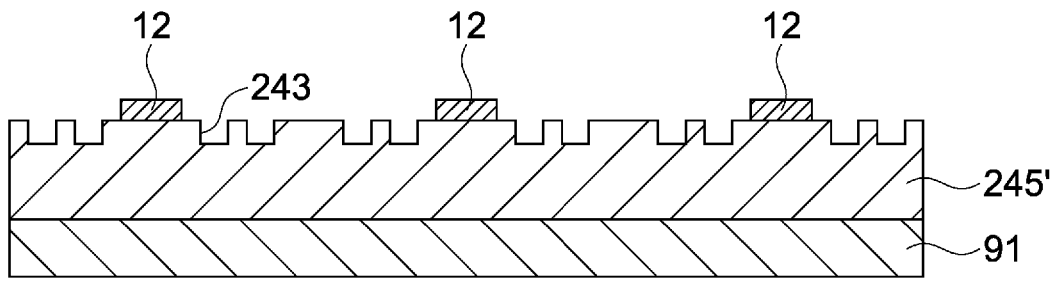
FIG. 8B shows a method of producing the light-emitting device according to the fifth embodiment in the order.

As shown in FIG. 8B, a conductive film is formed on the semiconductor layer 245' and the second electrode 12 is formed by photolithography and etching. Then, the texture structure by the concave parts 243 is formed on the semiconductor layer 245'.

Figure 8C:
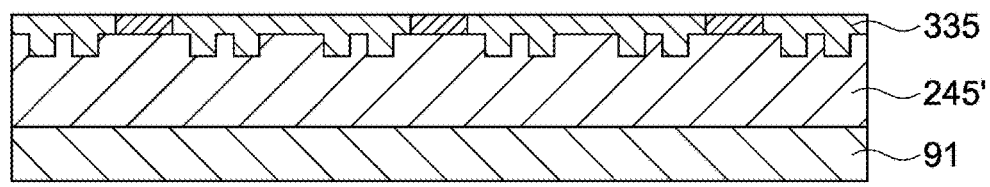
FIG. 8C shows a method of producing the light-emitting device according to the fifth embodiment in the order.

As shown in FIG. 8C, the insulation layer 335 (a part of the insulation layer 33) is formed on the semiconductor layer 245'. The insulation layer 335 is formed by vapor deposition, sputtering or the like, as described above.

Figure 8D:
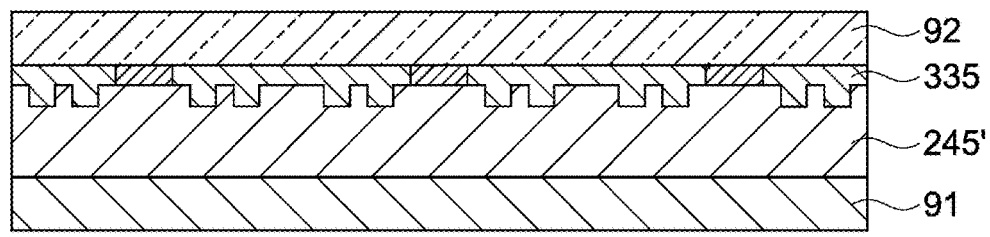
FIG. 8D shows a method of producing the light-emitting device according to the fifth embodiment in the order.

As shown in FIG. 8D, a transparent substrate 92 (second substrate) is bonded to the semiconductor layer 245' from an opposite side of the support substrate 91 via the bond layer composed of a polyimide based resin (not shown), for example.

Figure 8E:
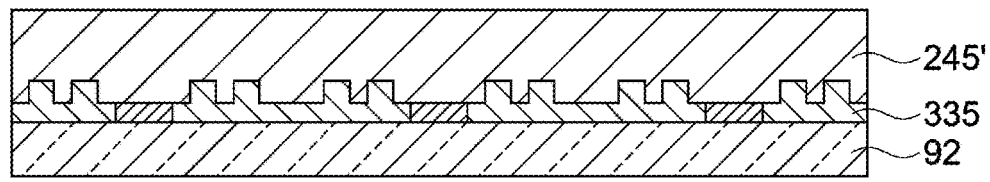
FIG. 8E shows a method of producing the light-emitting device according to the fifth embodiment in the order.

Thereafter, as shown in FIG. 8E, the support substrate 91 is removed from the semiconductor layer 245'. For example, when the support substrate 91 is a GaAs substrate, it is removed by grinding and ammonia hydrogen peroxide using the first conductivity type layer (for example, AlGaInP).

Figure 9A:
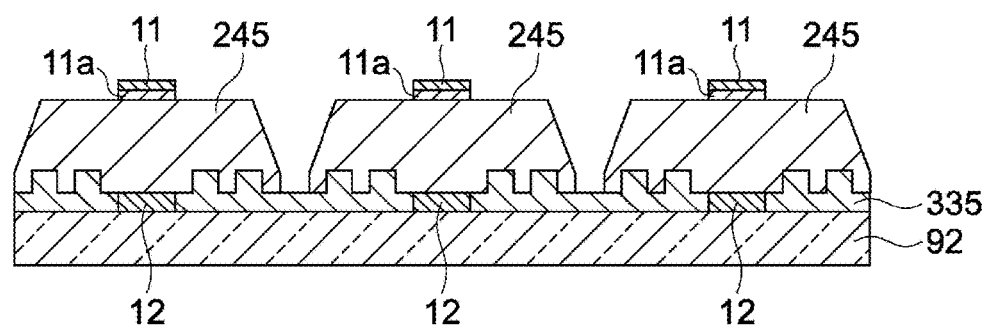
FIG. 9A shows the method of producing the light-emitting device after FIG. 8E.

Next, as shown in FIG. 9A, the first electrodes 11 and the first contact layers 11a are formed on the semiconductor layer 245' (the first conductivity type layer 21 shown in FIG. 7). The first electrodes 11 and the first contact layers 11a are formed by film formation, photolithography and etching. As shown in FIGS. 3A to 3C, the semiconductor layer 245 is shaped by the reactive ion etching. In this manner, as shown in FIG. 9A, one semiconductor layer 245' is separated into a plurality of the semiconductor layers 245.

Figure 9B:
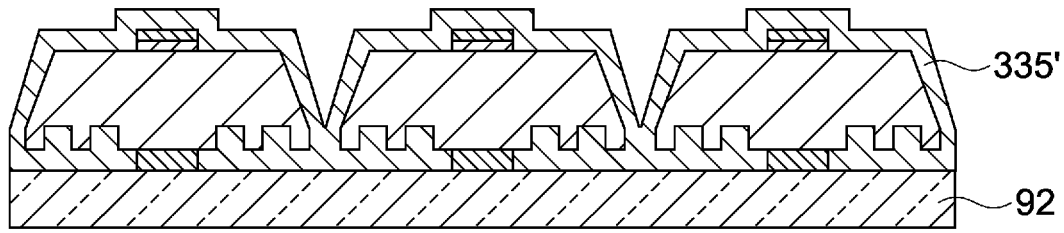
FIG. 9B shows the method of producing the light-emitting device after FIG. 8E.

As shown in FIG. 9B, an insulation layer 335' and the metal layer 35 (see FIG. 7) therein are formed by CVD, vapor deposition, sputtering or the like.

Figure 9C:
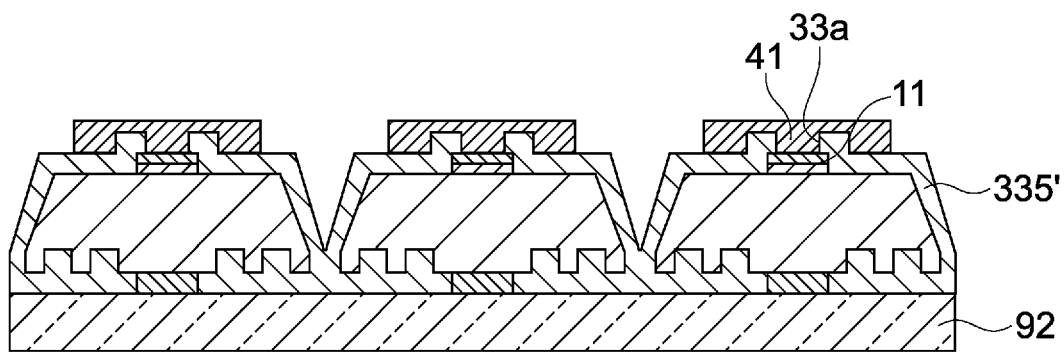
FIG. 9C shows the method of producing the light-emitting device after FIG. 8E.

As shown in FIG. 9C, openings 33a are formed by etching on the insulation layer 335' on the first electrodes 11, terminal electrodes 41 are formed by film formation, photolithography and etching. In this way, the first electrodes 11 and the terminal electrodes 41 are conducted.

After FIG. 9C, each light-emitting device (device layer) integrated by connecting with the insulation layer 335' is transferred to other transparent substrate (a substrate 10 of a wafer 150 that is the third substrate as described later). On the other transparent substrate, the respective light-emitting devices are separated by etching etc. Thereafter, the light-emitting devices are further transferred to other substrate (the fourth substrate) using a laser ablation method as described later.

Figure 9D:
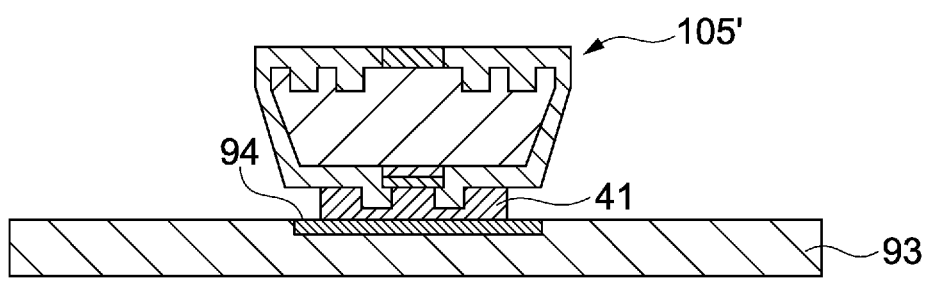
FIG. 9D shows the method of producing the light-emitting device after FIG. 8E.

After the respective light-emitting devices are separated, as shown in FIG. 9D, each light-emitting device 105' is transferred (mounted) on a mounting substrate 93. On the mounting substrate 93, a wiring 94 and an electrode pad are formed. In order to connect the terminal electrode 41 to the wiring 94, each light-emitting device 105' is mounted on the mounting substrate 93. In this case, the light-emitting device 105' is connected to the wiring 94 on the mounting substrate 93 by general solder bonding but desirably bonding by plating as described later.

Thereafter, the wiring electrode 42 (see FIG. 7) is formed to be connected to the second electrode 12, thereby providing the light-emitting device 105.

When the terminal electrode 41 connected to the first electrode 11 has an opening at a center or there are a plurality of the terminal electrodes 41, the light-emitting devices 101 may be temporarily fixed to the mounting substrate by the self-alignment method disposed in Japanese Patent Application Laid-open No. 2011-233733. After the temporal fixing, the light-emitting device 105' may be bonded by plating to the wiring 94 on the mounting substrate 93.

Sixth Embodiment

Next, as the sixth embodiment according to the present technology, an RGB package device corresponding to one pixel configured by arranging the light-emitting devices 105 emitting three colors of red (R), green (G) and blue (B).

(Configuration of Package Device)

Figure 10:
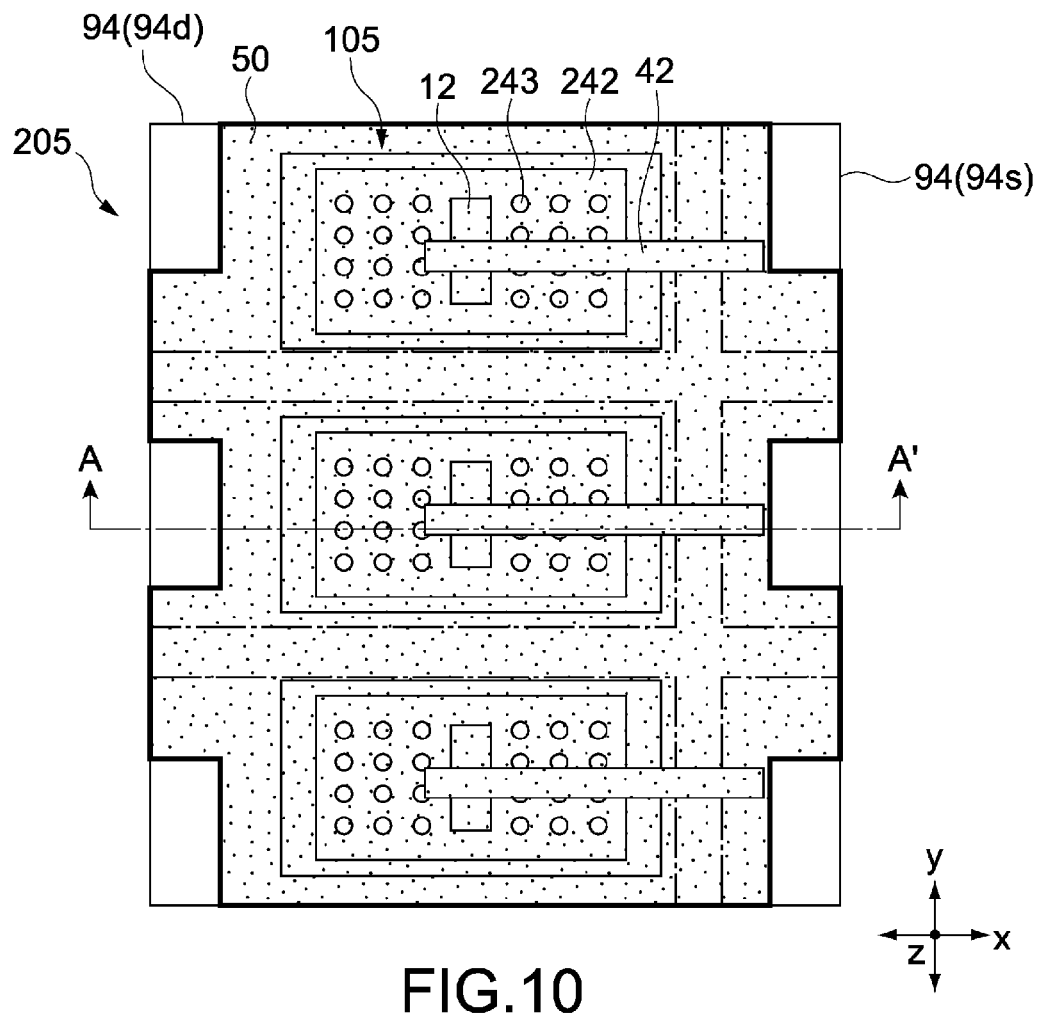
FIG. 10 is a plan diagram showing an RGB package device according to a sixth embodiment of the present technology.
Figure 11:
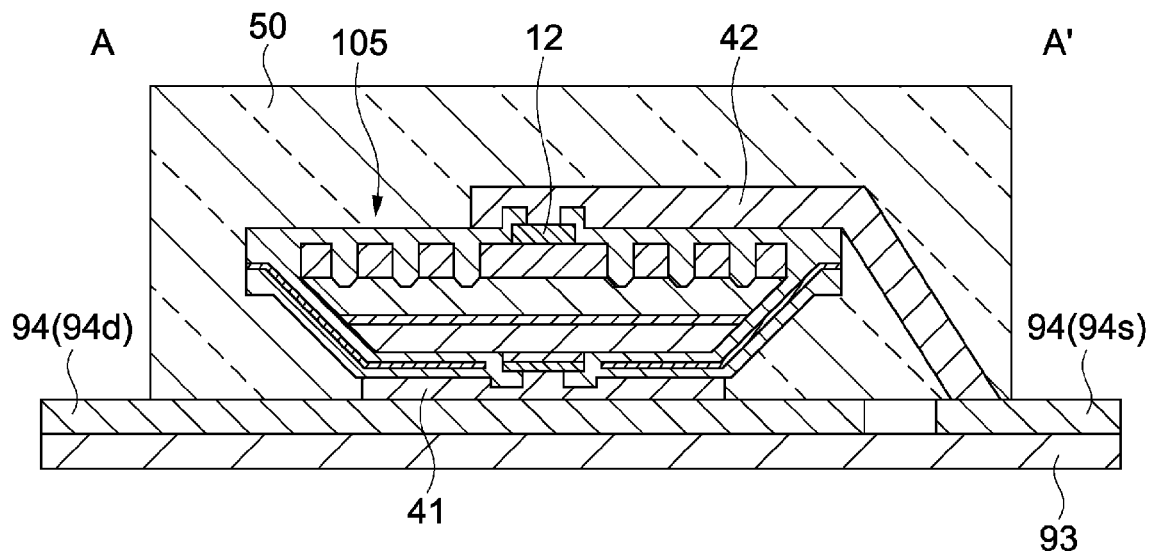
FIG. 11 is a cross-sectional diagram along an A-A line in FIG. 10.

FIG. 10 is a plan diagram showing an RGB package device 205. FIG. 11 is a cross-sectional diagram along an A-A line in FIG. 10. These three (R, G, B) light-emitting devices 105 have substantially the same shape and structure and are composed of different materials. In the G, B light-emitting devices 105, a GaN based material including AlGaN and InGaN is used. The R, G, B light-emitting devices 105 are arranged along the y direction, for example, but the arrangement is not limited thereto and may depend on the shapes of the light-emitting devices 105.

As shown in FIGS. 10 and 11, two types of wirings 94 are formed on the mounting substrate 93. These wirings 94 are a data line 94*d* and a scan line 94*s*. For example, a passive matrix driving system is used for a driving system of the light-emitting device 105. The data line 94*d* is connected to the terminal electrode 41 at a first electrode 11 side and the scan line 94*s* is connected to the wiring electrode 42 at a second electrode 12 side. These three R, G, G light-emitting devices 105 are packaged by a transparent resin seal 50 on the mounting substrate 93. In FIG. 10, the resin sealing part 50 is represented by a thick line and the wirings 94 are represented by an alternate long and short dash line. The resin sealing part 50 may be integral with other RGB package device (not shown).

As shown in FIG. 10, the texture structures composed of a plurality of the above-described concave parts 243 are disposed at both ends of the rectangular second electrodes 12 in the x direction. The respective concave parts 243 are arranged along the both x and y directions.

(Configuration of Light-Emitting Panel)

Figure 13:
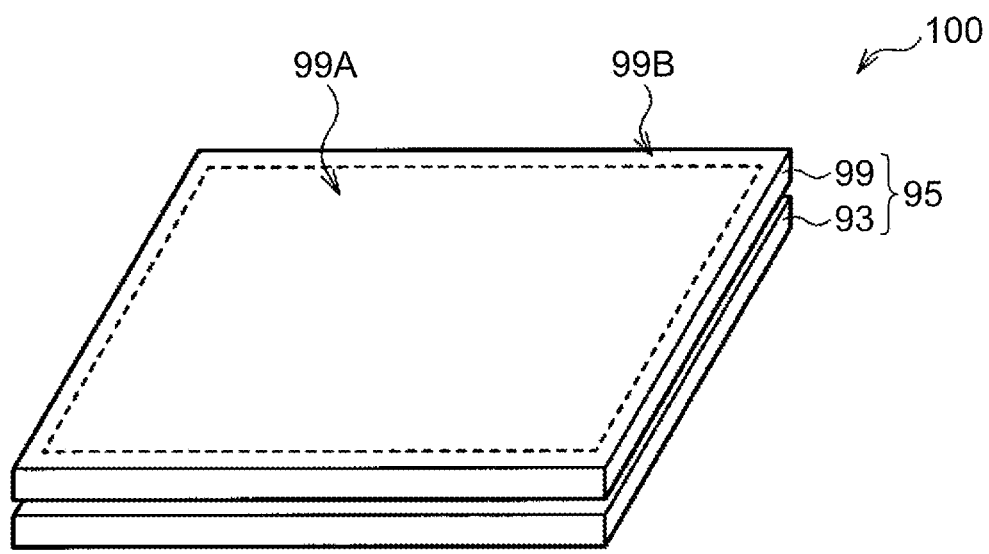
FIG. 13 is a perspective diagram schematically showing a light-emitting panel apparatus (display apparatus) including the RGB package device.

A display apparatus as a light-emitting panel apparatus is configured by arranging a plurality of the RGP package devices 205 shown in FIGS. 10 and 11 each forming one pixel in a matrix. FIG. 13 is a perspective diagram schematically showing a light-emitting panel apparatus (display apparatus) 100.

The light-emitting panel apparatus 100 includes a light-emitting panel 95 having the mounting substrate 93 including the RGB package devices 205, for example, and a transparent substrate 99 overlapped with the mounting substrate. A surface of the transparent substrate 99 is an image display surface. The transparent substrate 99 has a display area 99A and a frame area 99B that is a non-display area at peripheral thereof. The light-emitting panel apparatus 100 includes driving circuits (not shown) driving the respective light-emitting devices 105 on the mounting substrate 93.

In order to provide the transparent substrate 99 with flexibility, a reflection property and a property that boundaries are invisible after separation, a transparent resin may be applied or a transparent film may be adhered to the transparent substrate 99.

The light-emitting panel apparatus 100 also functions as a lighting apparatus as well as the display apparatus. When the light-emitting panel apparatus is the lighting apparatus, the three R, G, G light-emitting devices may not be necessarily used. At least one type of these light-emitting devices may be included and any arrangement may be made.

(Method of Producing Package Device)

Figure 12A:
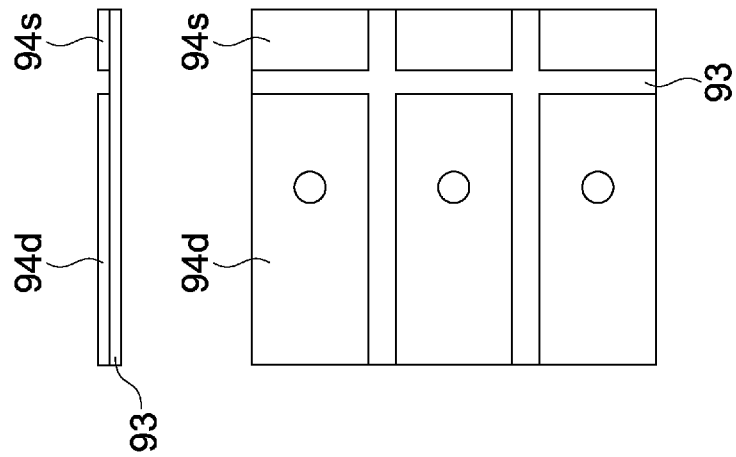
FIG. 12A shows a method of producing the RGB package device in the order.

FIGS. 12A to 12D show a method of producing an RGB package device 205 in the order. In each of FIG. 12A to 12D, upper diagrams represent cross-sectional views and lower diagrams represent plan views. As shown in FIG. 12A, the conductivity type layer that forms Al or Cu wirings (the data lines 94*d*, the scan lines 94*s*) is formed on the mounting substrate 93.

Figure 12B:
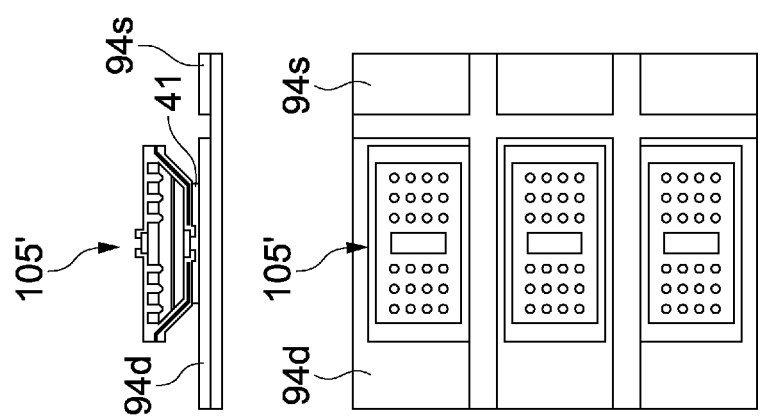
FIG. 12B shows a method of producing the RGB package device in the order.

As shown in FIG. 12B, the respective light-emitting devices 105' are mounted on the data lines 94*d*. The data lines 94*d* and the terminal electrodes 41 of the respective light-emitting devices 105' are bonded by plating. An area represented by a symbol 41 is where the terminal electrode and a plated layer are bonded.

Figure 12C:
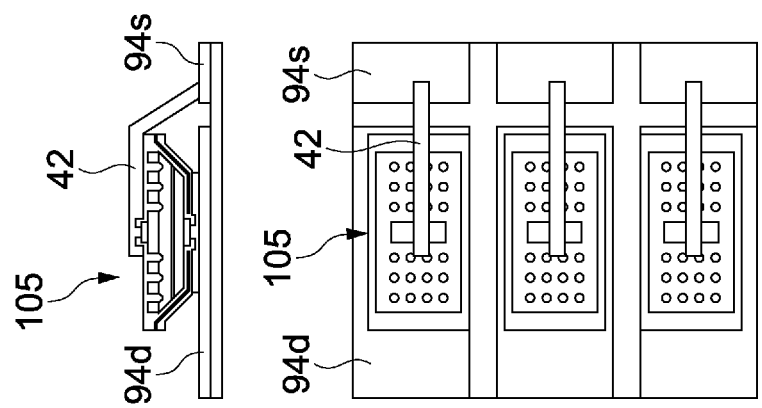
FIG. 12C shows a method of producing the RGB package device in the order.

As shown in FIG. 12C, the wiring electrodes 42 are formed by film formation, photolithography and etching and are connected to the scan lines 94*s*.

Figure 12D:
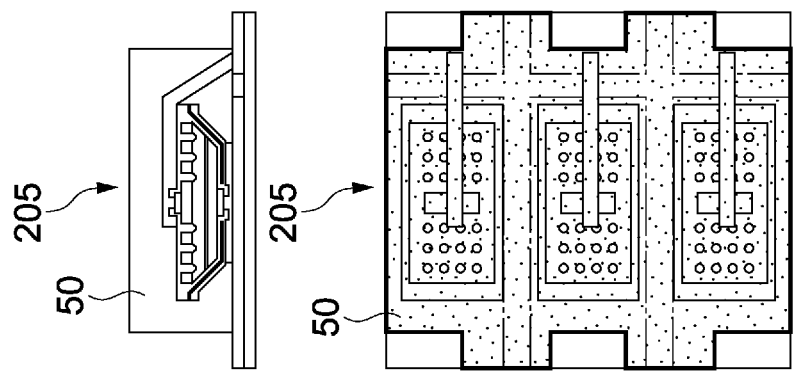
FIG. 12D shows a method of producing the RGB package device in the order.

As shown in FIG. 12D, the respective R, G, B light-emitting devices 105 are covered with resin to form the resin sealing part 50.

Seventh Embodiment

Figure 14:
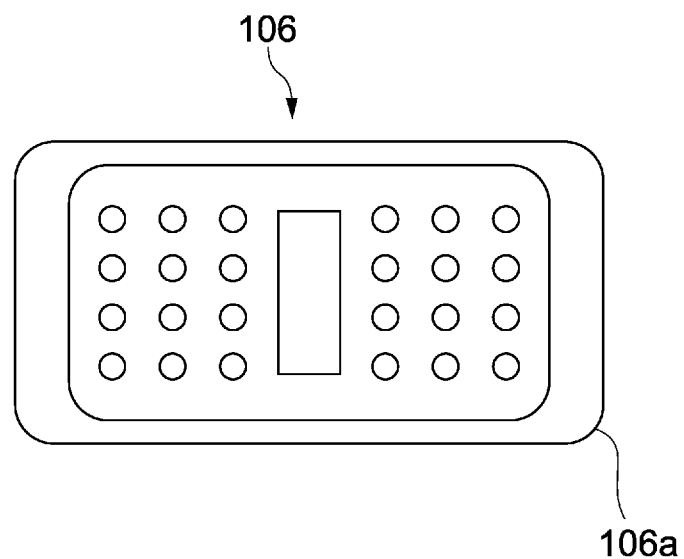
FIG. 14 is a plan diagram viewed in a vertical axis direction (lamination direction) of a light-emitting device according to a seventh embodiment and shows an alternative embodiment of an illustrative one light-emitting device shown in FIG. 12.

FIG. 14 is a plan diagram viewed in a vertical axis direction (lamination direction) of a light-emitting device according to a seventh embodiment and shows an alternative embodiment of an illustrative one light-emitting device shown in FIG. 12. As described referring to FIG. 4, when the light-emitting device is the micro LED having the length in the x and y directions of 5 micrometers to 100 micrometers, a light-emitting device 106 is designed to have rounded corners 106*a* viewed in the lamination direction, as shown in FIG. 14, thereby providing significant advantages.

By the rounded corners 106*a* of the light-emitting device 106, angulated areas are reduced to increase the strength of the corners 106*a* and to inhibit damages with certainty. Accordingly, particles and dusts can be decreased as describe above, it contributes to an improvement in the light-emitting efficiency and product reliability can be enhanced. In the production of the micro LED, it is important to reduce dusts, especially in the case of the LED having a great aspect ratio.

(Wafer)

Figure 15:
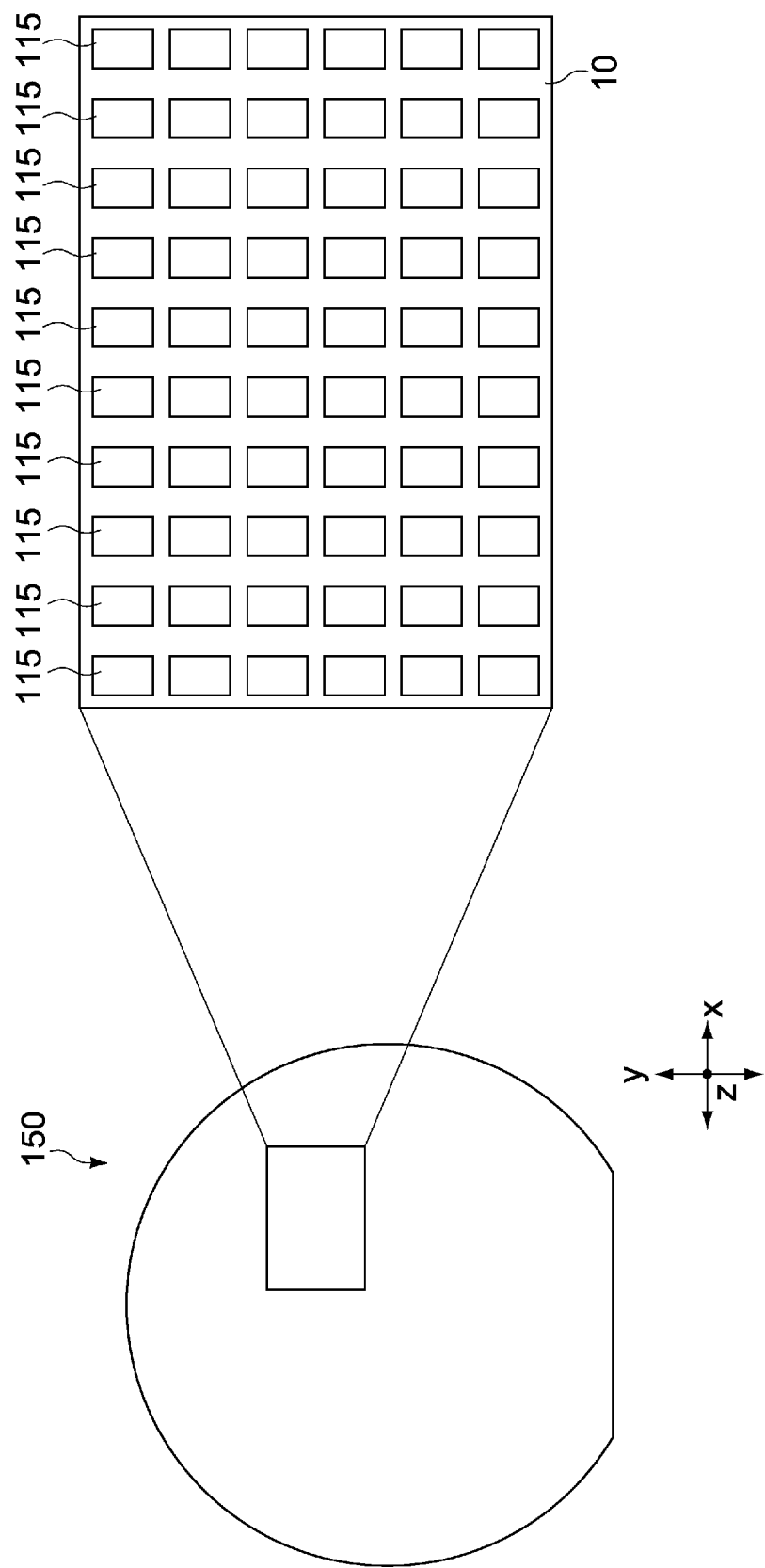
FIG. 15 is a plan diagram showing a wafer according to an embodiment.

FIG. 15 is a plan diagram showing a wafer according to an embodiment.

A wafer 150 includes the substrate 10 (third substrate) and a plurality of light-emitting devices (such as the light-emitting devices 105 in which the wiring electrode 42 and the like are not yet formed) 115. The wafer 150 has a configuration that a plurality of light-emitting devices 115 are regularly arranged on the substrate 10. Typically, the light-emitting devices 115 are arranged in a matrix.

The substrate 10 has a surface where the light-emitting elements 115 are arranged and is configured of 2 to 12 inch wafer, for example. Typically, on one wafer, the light-emitting elements 115 capable of emitting the same type of, i.e., the same color of light. As the substrate 10, a material having high transmittance to laser wavelength irradiated as described later is used. For example, the material is sapphire ($Al_2O_3$), quarts ($SiO_2$), glass or the like.

A bonded layer (not shown) is disposed to bond the substrate 10 and the light-emitting devices 115. The bonded layer is composed of a thermoplastic resin material having a bonding property such as polyimide, for example. The material of the bonded layer is not limited to the above and an ultraviolet ray curing resin, an adhesive sheet, an adhesive material etc. can be used.

In the process after FIG. 9C described above, the bonded layer is heated and ablated by irradiating laser having a predetermined wavelength via the substrate 10. By the ablation power, at least one light-emitting device 115 is easily separated from the substrate 10 and is transferred to the other substrate (fourth substrate). For the laser ablation, the substrate 10 is composed of the material that easily transmits laser, as described above.

Eighth Embodiment

Figure 16:
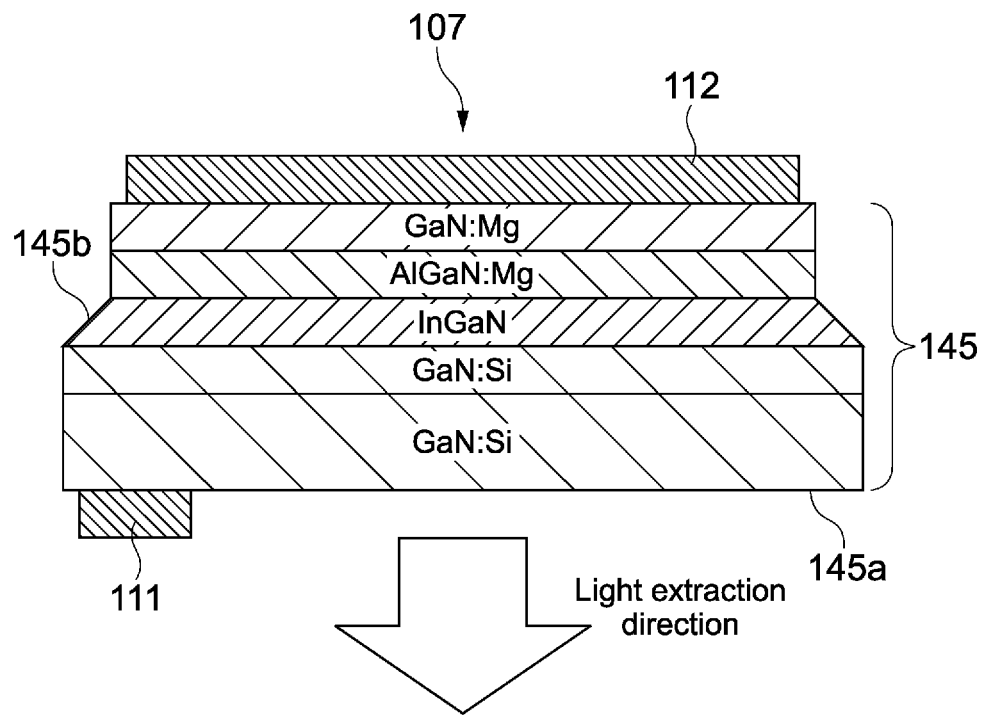
FIG. 16 is a cross-sectional diagram showing a configuration of a GaN based light-emitting device.

FIG. 16 is a cross-sectional diagram showing a configuration of a GaN based light-emitting device. A light-emitting device 107 includes a first electrode 111, a semiconductor layer 145 and a second electrode 112. The semiconductor layer 145 is composed of GaN:Si (Si doped), GaN:Si (Si doped), InGaN, AlGaN:Mg (Mg doped) and GaN:Mg (Mg doped) from a first electrode 11 side.

A substrate (not shown) where the semiconductor layer 145 is grown may be any of sapphire, Si, SiC, GaN or the like. The substrate is removed by grinding or laser peeling to form a light-extraction surface 145a at the first electrode 11 side.

On the semiconductor layer 145, the first electrodes 11 and the second electrode 12 are formed by film formation, photolithography and etching. By the etching as described referring to FIG. 3, the side surface of InGaN including In is formed as the slope (the first angle to the lamination direction). The side surfaces of other layers are formed at nearly vertical angle smaller than the first angle in the lamination direction. By the etching in a separate process, the semiconductor layer 145 is separated into a plurality of the light-emitting devices 107.

Ninth Embodiment

Figure 17:
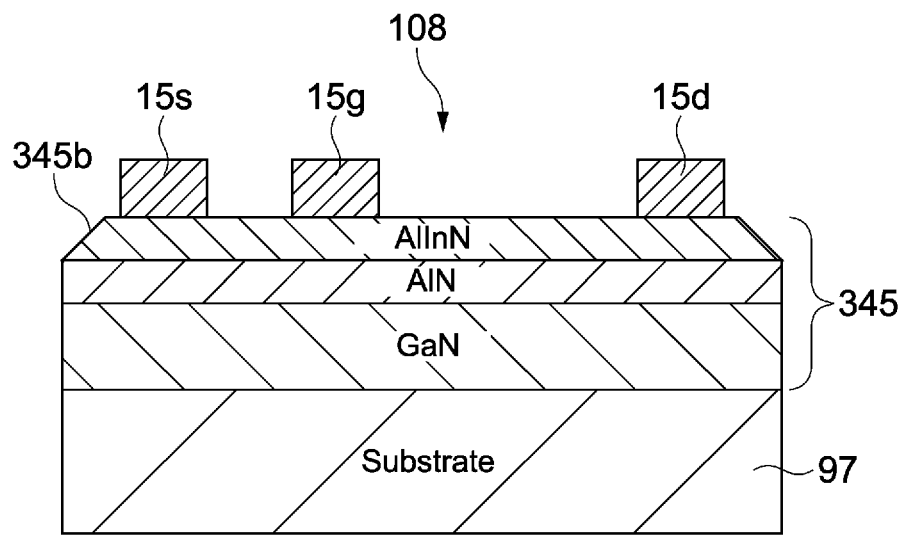
FIG. 17 is a cross-sectional diagram showing a configuration of an HEMT (High Electron Mobility Transistor) device used as a semiconductor device, e.g., a switching device.

FIG. 17 is a cross-sectional diagram showing a configuration of an HEMT (High Electron Mobility Transistor) device used as a semiconductor device, e.g., a switching device.

The HEMT device 108 includes GaN, AlN and AlInN layers as semiconductor layers 345 on a substrate 97. On AlInN, a source electrode 15s, a gate electrode 15g and a drain electrode 15d are provided.

The substrate 97 is for growing the semiconductor layer 345 and may be composed of any of sapphire, Si, SiC, GaN or the like. By the etching as described referring to FIG. 3, a side surface 345b of AlInN including In is formed as the slope having the first angle. By the etching in a separate process, the semiconductor layer 345 is separated into a plurality of the light-emitting devices 101.

The HEMT device is a micro-order device having one side size of several micrometers to tens micrometers viewed planarly and includes the semiconductor layer 345 having a thickness of 1 micrometer to several micrometers.

Other Embodiments

The present technology is not limited to the above-described embodiments, and other various embodiments can be made.

In the above description, examples of the semiconductor device include the light-emitting device and the HEMT device. Furthermore, the present technology is applicable to other semiconductor devices including In.

In the fifth embodiment in FIG. 11, the concave parts 243 are disposed as the texture structure in the light-emitting device 105 including the side surface 251 having the first angle and the side surface 241 having the second angle. It is also within the present technology that a light-emitting device having no side surface with angular discontinuity, which is the characteristic structure of the present technology, includes the concave parts as the texture structure.

It should be understood by those skilled in the art that various modifications, combinations, sub-combinations and alterations may occur depending on design requirements and other factors insofar as they are within the scope of the appended claims or the equivalents thereof.

It is also possible to combine at least two features of the above-described features of the embodiments.

The present disclosure may have the following configurations.

(1) A semiconductor device, including:

a first semiconductor layer formed by growing in a lamination direction and containing In (indium), having a main surface that is a growth surface formed by growing in a lamination direction and a side surface disposed at a first angle; and a second semiconductor layer having a side surface continuously disposed on the side surface of the first semiconductor layer at an atomic layer level at a second angle different from the first angle in the lamination direction, and containing no In.

(2) The semiconductor device according to (1) above, in which the respective side surfaces of the first semiconductor layer and the second semiconductor layer are configured such that the first angle is greater than the second angle in the lamination direction of the first semiconductor layer and the second semiconductor layer.

(3) The semiconductor device according to (1) or (2) above, in which the semiconductor device further includes a first conductivity type layer, an active layer and a second conductivity type layer, and the first semiconductor layer includes at least one of these three layers.

(4) The semiconductor device according to (3) above, in which the first semiconductor layer contains AlGaInP or GaInP, and the second semiconductor layer contains GaP.

(5) The semiconductor device according to (3) above, in which the first semiconductor layer contains InGaN, and the second semiconductor layer contains GaN.

(6) The semiconductor device according to any one of (3) to (5) above, in which the semiconductor device further includes a first contact layer connected to the first conductivity type layer, the first semiconductor layer includes the second conductivity type layer, and the second semiconductor layer may include a second contact layer connected via an intermediate layer or directly to the second conductivity type layer.

(7) The semiconductor device according to any one of (3) to (5) above, in which the first semiconductor layer includes the second conductivity type layer, and the second semiconductor layer may include a second contact layer connected via an intermediate layer or directly to the second conductivity type layer, the semiconductor device further includes a first electrode connected to the first contact layer and a second electrode connected to the second contact layer.

(8) The semiconductor device according to (6) or (7) above, further including:

an insulation layer covering the respective side surfaces of the first semiconductor layer and the second semiconductor layer, and a metal layer disposed within the insulation layer facing to the side surface.

(9) The semiconductor device according to (6) or (7) above, in which the second contact layer includes the light-extraction surface opposite to the surface of the second conductivity type layer, and the second contact layer and the second conductivity type layer have concave parts continuously formed from the light-extraction surface to the second conductivity type layer not arriving at the active layer.

(10) The semiconductor device according to (9) above, in which the concave part has a first inner surface having a third angle in the first semiconductor layer and a second inner surface having a fourth angle different from the first angle in the second semiconductor layer.

(11) The semiconductor device according to any one of (1) to (10) above, in which vertical and horizontal lengths viewed in the lamination direction of the semiconductor device are 5 micrometers to 100 micrometers.

(12) The semiconductor device according to (11) above, in which an angular part viewed in the lamination direction of the semiconductor device is be rounded.

(13) The semiconductor device according to (1) above, in which the first semiconductor layer contains AlInN, and
the second semiconductor layer contains AlN.

(14) The semiconductor device according to any one of (3) to (13) above, in which thicknesses of the first semiconductor layer and the second semiconductor layer are greater than a value provided by dividing a wavelength of light emitted from the active layer by a refractive index.

(15) A semiconductor device, including:

a first semiconductor layer formed by growing in a lamination direction containing In (indium); and a second semiconductor layer containing no In continuously laminated on the first semiconductor layer at an atomic layer level in the lamination direction, the first semiconductor layer and the second semiconductor layer having concave parts continuously formed on these layers, the concave part having a first inner surface having a first angle to the lamination direction in the first semiconductor layer and a second inner surface having a second angle different from the first angle to the lamination direction in the second semiconductor layer.

(16) A package device, including:

a substrate;

a plurality of semiconductor devices mounted on the substrate; and a resin sealing part disposed on the substrate and covering a plurality of the semiconductor devices, at least one of a plurality of the semiconductor devices having a first semiconductor layer having a main surface that is a growth surface formed by growing in a lamination direction and a side surface disposed at a first angle to the lamination direction, and containing In (indium) and a second semiconductor layer having a side surface continuously disposed on the side surface of the first semiconductor layer at an atomic layer level at a second angle different from the first angle in the lamination direction, and containing no In.

(17) A light-emitting panel apparatus, including:

a light-emitting panel including a substrate, a plurality of light-emitting devices mounted on the substrate, and a resin sealing part disposed on the substrate covering a plurality of the light-emitting devices; and a driving circuit driving the light-emitting panel, at least one of a plurality of the light-emitting devices having a first semiconductor layer having a main surface that is a growth surface formed by growing in a lamination direction and a side surface disposed at a first angle to the lamination direction, and containing In (indium) and a second semiconductor layer having a side surface continuously disposed on the side surface of the first semiconductor layer at an atomic layer level at a second angle different from the first angle in the lamination direction, and containing no In.

(18) A wafer, including:

a substrate and a plurality of semiconductor devices regularly arranged on the substrate, at least one of a plurality of the semiconductor devices having a first semiconductor layer having a main surface that is a growth surface formed by growing in a lamination direction and a side surface disposed at a first angle to the lamination direction, and containing In (indium) and a second semiconductor layer having a side surface continuously disposed on the side surface of the first semiconductor layer at an atomic layer level at a second angle different from the first angle in the lamination direction, and containing no In.

(19) A method of producing a semiconductor device, including:

forming by laminating a first semiconductor layer containing In (indium) and a second semiconductor layer containing no In;

etching the first semiconductor layer and the second semiconductor layer such that a side surface of the first semiconductor layer is formed to have a first angle and such that a side surface of the second semiconductor layer continuously disposed on a side surface of the first semiconductor layer is formed at a second angle different from the first angle in the lamination direction.

(20) A method of producing a semiconductor device according to (19) above, in which in the etching step, an anisotropy etching is performed.

(21) A method of producing a semiconductor device according to (20) above, in which in the lamination step of the first semiconductor layer and the second semiconductor layer, the first semiconductor layer is crystal-grown on a first substrate to crystal-grow the second semiconductor layer on the first semiconductor layer, the method of producing a semiconductor device further including:

bonding the first and second semiconductor layers to a second substrate from an opposite side of the first substrate; and removing the first substrate after the second substrate is bonded, the anisotropy etching being performed such that the first and second semiconductor layers are removed from the first semiconductor layer side to the second semiconductor layer side after the first substrate is removed.

(22) A method of producing a semiconductor device according to (21) above, in which after the anisotropy etching, a device layer including the first and second semiconductor layers is transferred to a third substrate, and a transferred device layer is separated into a plurality of semiconductor devices.

(23) A method of producing a semiconductor device according to (22) above, in which the third substrate is composed of a material that transmits laser having a predetermined wavelength, and after separating into a plurality of semiconductor devices, at least one semiconductor device is transferred to a fourth substrate using a laser ablation method by the laser having a predetermined wavelength.

(24) A semiconductor device, comprising:
a first semiconductor layer having a main surface that is a growth surface in a lamination direction and a first side surface disposed at a first angle; and
a second semiconductor layer adjacent the first semiconductor layer having a second side surface extending from the first side surface of the first semiconductor layer at a second angle different from the first angle.

(25) The semiconductor device according to (24), wherein the respective first and second side surfaces of the first semiconductor layer and the second semiconductor layer are configured such that the first angle is greater than the second angle with respect to the lamination direction.

(26) The semiconductor device according to (24), wherein the semiconductor device further includes a first conductivity type layer, an active layer, and a second conductivity type layer, and the first semiconductor layer includes at least one of the first conductivity type layer, the active layer, and the second conductivity type layer.

(27) The semiconductor device according to (26), wherein the first semiconductor layer comprises AlGaInP or GaInP, and the second semiconductor layer comprises GaP.

(28) The semiconductor device according to (26), wherein the first semiconductor layer comprises InGaN, and the second semiconductor layer comprises GaN.

(29) The semiconductor device according to (26), wherein the semiconductor device further includes a first contact layer connected to the first conductivity type layer,
the first semiconductor layer includes the second conductivity type layer, and
the second semiconductor layer comprises a second contact layer connected via an intermediate layer or directly to the second conductivity type layer.

(30) The semiconductor device according to (26), wherein the first semiconductor layer includes the second conductivity type layer, and
the second semiconductor layer comprises a second contact layer connected via an intermediate layer or directly to the second conductivity type layer,
the semiconductor device further includes a first electrode connected to a first contact layer and a second electrode connected to the second contact layer.

(31) The semiconductor device according to (29), further comprising:
an insulation layer covering the respective side surfaces of the first semiconductor layer and the second semiconductor layer, and
a metal layer disposed within the insulation layer facing to the side surface.

(32) The semiconductor device according to (29), wherein the second contact layer includes a light-extraction surface opposite to the surface of the second conductivity type layer, and
the second contact layer and the second conductivity type layer have concave features extending from the light-extraction surface into the second conductivity type layer.

(33) The semiconductor device according to (32), wherein the concave features have a first inner surface having a third angle in the first semiconductor layer and a second inner surface having a fourth angle different from the first angle in the second semiconductor layer.

(34) The semiconductor device according to (24), wherein dimensions of the semiconductor device transverse to the lamination direction range from 5 micrometers to 100 micrometers.

(35) The semiconductor device according to (34), wherein corners at a periphery of the semiconductor device, when viewed in the lamination direction, are rounded.

(36) The semiconductor device according to (24), wherein the first semiconductor layer comprises AlInN, and
the second semiconductor layer comprises AlN.

(37) The semiconductor device according to (26), wherein thicknesses of the first semiconductor layer and the second semiconductor layer are greater than a value provided by dividing a wavelength of light emitted from the active layer by a refractive index of each respective layer.

(38) A semiconductor device, comprising:
a first semiconductor layer; and
a second semiconductor layer formed on the first semiconductor layer in a lamination direction, wherein
the first semiconductor layer and the second semiconductor layer have concave parts formed into the respective layers, and
the concave parts have a first inner surface having a first angle with respect to the lamination direction in the first semiconductor layer and a second inner surface having a second angle different from the first angle in the second semiconductor layer.

(39) A packaged device, comprising:
a substrate;
a plurality of semiconductor devices mounted on the substrate; and
a resin sealing part disposed on the substrate and covering at least some of the plurality of semiconductor devices, wherein
at least one of the plurality of the semiconductor devices has a first semiconductor layer having a main surface that is perpendicular to a lamination direction and a side surface disposed at a first angle with respect to the lamination direction, and
a second semiconductor layer adjacent the first semiconductor layer has a side surface extending from the side surface of the first semiconductor layer at a second angle different from the first angle.

(40) A light-emitting panel apparatus, comprising:
a light-emitting panel including a substrate, a plurality of light-emitting devices mounted on the substrate, and a resin sealing part disposed on the substrate covering at least some of the plurality of the light-emitting devices; and
a driving circuit driving the light-emitting panel, wherein
at least one of the plurality of the light-emitting devices has a first semiconductor layer having a main surface that is perpendicular to a lamination direction and a side surface disposed at a first angle with respect to the lamination direction, and
a second semiconductor layer adjacent the first semiconductor layer has a side surface extending from the side surface of the first semiconductor layer at a second angle different from the first angle.

(41) A wafer, comprising:
a substrate and a plurality of semiconductor devices regularly arranged on the substrate, at least one of a plurality of the semiconductor devices having
a first semiconductor layer having a main surface that is perpendicular to a lamination direction and a side surface disposed at a first angle with respect to the lamination direction, and a second semiconductor layer adjacent the first semiconductor layer having a side surface extending from the side surface of the first semiconductor layer at a second angle different from the first angle.

(42) A method of producing a semiconductor device, comprising:
epitaxially growing a first semiconductor layer;
epitaxially growing in a growth direction a second semiconductor layer adjacent the first semiconductor layer; and
etching at least one of the first semiconductor layer or the second semiconductor layer such that a side surface of the first semiconductor layer has a first angle with respect to the growth direction and such that a side surface of the second semiconductor layer has a second angle different from the first angle.

(43) A method of producing a semiconductor device according to (32), wherein the etching comprises anisotropic etching.

(44) The semiconductor device according to (24), further comprising:
an insulating layer covering the first and the second semiconductor layers,
a first contact layer being formed over the first semiconductor layer,
a second contact layer being formed below the second conductivity type layer, and
a terminal electrode being formed over the first semiconductor layer via the first contact layer.

(45) The semiconductor device according to (24), wherein the first semiconductor layer contains indium and the second semiconductor layer contains no indium.

(46) The semiconductor device according to (24), wherein the first semiconductor layer is an epitaxial layer.

(47) The semiconductor device of (38), wherein the first semiconductor layer contains indium and the second semiconductor layer contains no indium.

(48) The semiconductor device of (38), wherein the first semiconductor layer is an epitaxial layer.

(49) The packaged device of (39), wherein the first semiconductor layer contains indium and the second semiconductor layer contains no indium.

(50) The packaged device of (39), wherein the first semiconductor layer is an epitaxial layer.

(51) The light-emitting panel apparatus of (40), wherein the first semiconductor layer contains indium and the second semiconductor layer contains no indium.

(52) The light-emitting panel apparatus of (40), wherein the first semiconductor layer is an epitaxial layer.

(53) The wafer of (41), wherein the first semiconductor layer contains indium and the second semiconductor layer contains no indium.

(54) The wafer of (41), wherein the first semiconductor layer is an epitaxial layer.

(55) The method of (42), wherein epitaxially growing the first semiconductor layer comprises growing the first semiconductor layer to contain indium, and wherein epitaxially growing the second semiconductor layer comprises growing the second semiconductor layer to contain no indium.

REFERENCE SIGNS LIST 11, 111 first electrode
12, 112 second electrode
21 first conductivity type layer
22 second conductivity type layer
23 active layer
24 contact layer
25, 145, 245, 345 semiconductor layer
33 insulation layer
35 metal layer
50 resin sealing part
95 light-emitting panel
100 light-emitting panel apparatus
101 to 107 light-emitting device
108 HEMT device
205 RGB package device
145b, 241, 251, 345b side surface
242 light-extraction surface
243a first inner surface
243b second inner surface
243 concave part

The invention claimed is:

1. A semiconductor device, comprising:
a first semiconductor layer including a first semiconductor material and having a main surface that is a growth surface in a lamination direction and a first side surface disposed at a first angle;
a second semiconductor layer formed from a second semiconductor material that is different from the first semiconductor material, the second semiconductor layer located adjacent to the growth surface of the first semiconductor layer and having a second side surface extending from the first side surface of the first semiconductor layer at a second angle different from the first angle; and
a light-extraction surface located on a side of the second semiconductor layer opposite the first semiconductor layer, wherein the respective first and second side surfaces of the first semiconductor layer and the second semiconductor layer are configured such that the first angle is greater than the second angle with respect to the lamination direction.

2. The semiconductor device according to claim 1, wherein the semiconductor device further includes a first conductivity type layer, an active layer, and a second conductivity type layer, and the first semiconductor layer includes at least one of the first conductivity type layer, the active layer, and the second conductivity type layer.

3. The semiconductor device according to claim 2, wherein the first semiconductor layer comprises AlGaInP or GaInP, and the second semiconductor layer comprises GaP.

4. The semiconductor device according to claim 2, wherein the first semiconductor layer comprises InGaN, and the second semiconductor layer comprises GaN.

5. The semiconductor device according to claim 2, wherein
the semiconductor device further includes a first contact layer connected to the first conductivity type layer,
the first semiconductor layer includes the second conductivity type layer, and
the second semiconductor layer comprises a second contact layer connected via an intermediate layer or directly to the second conductivity type layer.

6. The semiconductor device according to claim 5, further comprising:
an insulation layer covering the respective side surfaces of the first semiconductor layer and the second semiconductor layer, and
a metal layer disposed within the insulation layer facing to the first side surface.

7. The semiconductor device according to 6, wherein the second contact layer includes the light-extraction surface, and the second contact layer and the second conductivity type layer have concave features extending from the light-extraction surface into the second conductivity type layer.

8. The semiconductor device according to claim 7, wherein the concave features have a first inner surface having a third angle in the first semiconductor layer and a second inner surface having a fourth angle different from the first angle in the second semiconductor layer.

9. The semiconductor device according to claim 2, wherein
the first semiconductor layer includes the second conductivity type layer, and
the second semiconductor layer comprises a second contact layer connected via an intermediate layer or directly to the second conductivity type layer,
the semiconductor device further includes a first electrode connected to a first contact layer and a second electrode connected to the second contact layer.

10. The semiconductor device according to claim 2, wherein thicknesses of the first semiconductor layer and the second semiconductor layer are greater than a value provided by dividing a wavelength of light emitted from the active layer by a refractive index of each respective layer.

11. The semiconductor device according to claim 1, wherein a dimension of the semiconductor device transverse to the lamination direction is in a range from 5 micrometers to 100 micrometers.

12. The semiconductor device according to claim 11, wherein corners at a periphery of the semiconductor device, when viewed in the lamination direction, are rounded.

13. The semiconductor device according to claim 1, wherein
the first semiconductor layer comprises AlInN, and
the second semiconductor layer comprises AlN.

14. The semiconductor device according to claim 1, further comprising:
an insulating layer covering the first and the second semiconductor layers,
a first contact layer being formed over the first semiconductor layer,
a second contact layer being formed below the second semiconductor layer, and
a terminal electrode being formed over the first semiconductor layer via the first contact layer.

15. The semiconductor device according to claim 1, wherein the first semiconductor layer contains indium and the second semiconductor layer contains no indium.

16. The semiconductor device according to claim 1, wherein the first semiconductor layer is an epitaxial layer.

17. A semiconductor device, comprising:
a first semiconductor layer;
a second semiconductor layer formed on a growth surface of the first semiconductor layer in a lamination direction, wherein
the first semiconductor layer and the second semiconductor layer have concave parts formed into the respective layers, and
the concave parts comprising a first concave part having a first inner surface extending through the second semiconductor layer and having a first angle with respect to the lamination direction and a second concave part having a second inner surface that extends into the first semiconductor layer and having a second angle with respect to the lamination direction that is greater than the first angle and deflecting the second inner surface inward toward a center of the concave portion.

18. The semiconductor device of claim 17, wherein the first semiconductor layer contains indium and the second semiconductor layer contains no indium.

19. The semiconductor device of claim 17, wherein the first semiconductor layer is an epitaxial layer.

20. A packaged device, comprising:
a substrate;
a plurality of semiconductor devices mounted on the substrate; and
a resin sealing part disposed on the substrate and covering at least some of the plurality of semiconductor devices, wherein
at least one of the plurality of the semiconductor devices has a first semiconductor layer including a first semiconductor material and having a main surface that is perpendicular to a lamination direction and a side surface disposed at a first angle with respect to the lamination direction,
a second semiconductor layer formed from a second semiconductor material that is different from the first semiconductor material, the second semiconductor layer attaching to a side of the first semiconductor layer having the main surface, wherein the second semiconductor layer has a side surface extending from the side surface of the first semiconductor layer at a second angle different from the first angle and wherein the first semiconductor layer contains indium and the second semiconductor layer contains no indium, and
a light-extraction surface located on a side of the second semiconductor layer opposite the first semiconductor layer.

21. The packaged device of claim 20, wherein the first semiconductor layer is an epitaxial layer.

22. A light-emitting panel apparatus, comprising:
a light-emitting panel including a substrate, a plurality of light-emitting devices mounted on the substrate, and a resin sealing part disposed on the substrate covering at least some of the plurality of the light-emitting devices; and
a driving circuit driving the light-emitting panel, wherein
at least one of the plurality of the light-emitting devices has a first semiconductor layer including a first semiconductor material and having a main surface that is perpendicular to a lamination direction and a first side surface disposed at a first angle with respect to the lamination direction,
a second semiconductor layer formed from a second semiconductor material that is different from the first semiconductor material, the second semiconductor layer attaching to a side of the first semiconductor layer having the main surface, wherein the second semiconductor layer has a side surface extending from the side surface of the first semiconductor layer at a second angle different from the first angle and wherein the first semiconductor layer contains indium and the second semiconductor layer contains no indium, and
a light-extraction surface located on a side of the second semiconductor layer opposite the first semiconductor layer.

23. The light-emitting panel apparatus of claim 22, wherein the first semiconductor layer is an epitaxial layer.

24. A wafer, comprising:

a substrate and a plurality of semiconductor devices regularly arranged on the substrate, at least one of a plurality of the semiconductor devices having a first semiconductor layer including a first semiconductor material and having a main surface that is perpendicular to a lamination direction and a side surface disposed at a first angle with respect to the lamination direction, a second semiconductor layer formed from a second semiconductor material that is different from the first semiconductor material, the second semiconductor layer attaching to a side of the first semiconductor layer having the main surface, wherein the second semiconductor layer has a side surface extending from the side surface of the first semiconductor layer at a second angle different from the first angle and wherein the first semiconductor layer contains indium and the second semiconductor layer contains no indium, and a light-extraction surface located on a side of the second semiconductor layer opposite the first semiconductor layer.

25. The wafer of claim 24, wherein the first semiconductor layer is an epitaxial layer.

26. A method of producing a semiconductor device, comprising:

epitaxially growing, in a growth direction, a first semiconductor layer including a first semiconductor material, wherein epitaxially growing the first semiconductor layer comprises growing the first semiconductor layer to contain indium;

epitaxially growing in the growth direction a second semiconductor layer formed from a second semiconductor material that is different from the first semiconductor material, the second semiconductor layer located adjacent the first semiconductor layer, wherein epitaxially growing the second semiconductor layer comprises growing the second semiconductor layer to contain no indium;

etching at least one of the first semiconductor layer or the second semiconductor layer such that a side surface of the first semiconductor layer has a first angle with respect to the growth direction and such that a side surface of the second semiconductor layer has a second angle different from the first angle; and forming a light-extraction surface on a side of the second semiconductor layer opposite the first semiconductor layer.

27. A method of producing a semiconductor device according to claim 26, wherein the etching comprises anisotropic etching.

* * * * *